United States Patent
Kranz et al.

(10) Patent No.: US 10,323,958 B2
(45) Date of Patent: Jun. 18, 2019

(54) ASSEMBLY USING A MAGNETIC FIELD SENSOR FOR DETECTING A ROTATION AND A LINEAR MOVEMENT OF AN OBJECT

(71) Applicant: Allegro Microsystems, LLC, Manchester, NH (US)

(72) Inventors: Stefan Kranz, Lenzkirch (DE); Stephan Schurt, Friedenweiler (DE); Andreas P. Friedrich, Metz-Tessy (FR); Yannick Vuillermet, Voglans (FR)

(73) Assignee: Allegro MicroSystems, LLC, Manchester, NH (US)

( * ) Notice: Subject to any disclaimer, the term of this patent is extended or adjusted under 35 U.S.C. 154(b) by 203 days.

(21) Appl. No.: 15/074,358

(22) Filed: Mar. 18, 2016

(65) Prior Publication Data
US 2017/0268903 A1 Sep. 21, 2017

(51) Int. Cl.
*G01D 5/14* (2006.01)
*G01D 21/02* (2006.01)
*G01B 7/02* (2006.01)
*G01B 7/00* (2006.01)
*G01R 33/07* (2006.01)

(52) U.S. Cl.
CPC .......... *G01D 5/145* (2013.01); *G01B 7/003* (2013.01); *G01B 7/023* (2013.01); *G01D 21/02* (2013.01); *G01R 33/077* (2013.01)

(58) Field of Classification Search
CPC .............................. G01D 5/145; G01D 7/003

USPC ........................................... 324/207.2
See application file for complete search history.

(56) References Cited

U.S. PATENT DOCUMENTS

| | | |
|---|---|---|
| 5,841,621 A | 11/1998 | Dean et al. |
| 6,181,036 B1 | 1/2001 | Kazama et al. |
| 6,288,533 B1 | 9/2001 | Haeberli et al. |
| 6,459,261 B1 | 10/2002 | Luetzow et al. |
| 7,088,095 B1 | 8/2006 | Busch |
| 9,417,295 B2 | 8/2016 | Friedrich et al. |
| 9,605,975 B2 | 3/2017 | Foletto et al. |
| 2004/0239313 A1 | 12/2004 | Godkin |
| 2008/0174301 A1 | 7/2008 | Mattson |
| 2008/0184799 A1* | 8/2008 | Phan Le ............... G01P 15/105 73/514.31 |
| 2009/0001965 A1 | 1/2009 | Ausserlechner et al. |
| 2009/0102463 A1 | 4/2009 | May |

(Continued)

FOREIGN PATENT DOCUMENTS

| | | |
|---|---|---|
| DE | 10 2006 037 226 A1 | 2/2008 |
| WO | WO2015/013705 | 1/2015 |

OTHER PUBLICATIONS

PCT Communication relating to the results of the partial international search for PCT/US2017/020067 dated Jun. 7, 2017; 11 pages.

(Continued)

*Primary Examiner* — Reena Aurora
(74) *Attorney, Agent, or Firm* — Daly, Crowley, Mofford & Durkee, LLP

(57) ABSTRACT

An assembly has a base structure, a rotatable structure, a first magnet coupled to the base structure, a second magnet coupled to the rotatable structure, and a magnetic field sensor. The magnetic field sensor can identify at least one condition (i.e., position) of the assembly.

21 Claims, 20 Drawing Sheets

(56) References Cited

U.S. PATENT DOCUMENTS

| | | |
|---|---|---|
| 2009/0146647 A1 | 6/2009 | Ausserlechner |
| 2010/0188074 A1 | 7/2010 | Matsumoto et al. |
| 2011/0227568 A1 | 9/2011 | Dordet et al. |
| 2012/0158335 A1 | 6/2012 | Donovan et al. |
| 2012/0262155 A1 | 10/2012 | Donovan et al. |
| 2013/0320970 A1 | 12/2013 | Foletto et al. |
| 2015/0022187 A1 | 1/2015 | Taylor et al. |
| 2015/0022188 A1 | 1/2015 | Daubert et al. |
| 2015/0176962 A1 | 6/2015 | Kerdraon et al. |
| 2015/0377648 A1* | 12/2015 | Sirohiwala ............. G01D 5/145 324/207.2 |
| 2016/0178401 A1 | 6/2016 | Hakspiel et al. |

OTHER PUBLICATIONS

PCT Search Report and Written Opinion of ISA for PCT/US2014/070339 dated Mar. 25, 2015; 16 pages.
Preliminary Amendment filed on Feb. 24, 2015; for U.S. Appl. No. 14/570,357; 12 pages.
PCT International Search Report and Written Opinion dated May 18, 2017 for PCT International Appl. No. PCT/US2017/014505; 14 pages.
Letter from A.A. Thornton letter dated Feb. 13, 2017 regarding amended claims for EP Pat. Appl. No. 14827615,7; 4 pages.
Amended Claims pp. 36 to 45 regarding A.A. Thornton letter dated Feb. 13, 2017 for EP Pat. Appl. No. 14827615.7; 10 pages.
PCT International Search Report and Written Opinion dated May 18, 2017 for International PCT Application No. PCT/US/2017/014505; 14 pages.
EP Communication under Rule 71(3) EPC Intention to Grant dated Aug. 10, 2017 for EP Application No. 14827615.7; 7 pages.
EP Allowed Specification dated Jul. 2, 2015 for EP Application No. 14827615.7; 55 pages.
Notice of Allowance dated Oct. 6, 2017 for U.S. Appl. No. 15/042,469; 14 pages.
Notice of Allowance dated Jan. 13, 2017 corresponding to U.S. Appl. No. 14/570,357; 11 Pages.
Response filed on Dec. 9, 2016 to Office Action dated Sep. 15, 2016; for U.S. Appl. No. 14/570,357; 26 pages.
Office Action dated Sep. 15, 2016 for U.S. Appl. No. 14/570,357; 17 pages.
U.S. Appl. No. 15/042,469, filed Feb. 12, 2016, Tima et al.
PCT International Preliminary Report on Patentability and Written Opinion dated Jul. 7, 2016; for PCT Pat. App. No. PCT/US2014/070339; 14 pages.

* cited by examiner

| Field along x | Field along y | Detected position |
|---|---|---|
| Bx<T1 | By<T2 | A2 |
| Bx<T1 | T2<By<T3 | C2 |
| Bx<T1 | By>T3 | D2 |
| Bx>T1 | By<T2 | B2 |
| Bx>T1 | T2<By<T3 | E2 |
| Bx>T1 | By>T3 | F2 |

2900

| | 2902 | 2904 | 2906 |
|---|---|---|---|
| | Field along x | Field along y | Detected position |
| | Bx>T3 | By <T1 | A2 |
| | T2<Bx <T3 | By <T1 | C2 |
| | Bx<T2 | By <T1 | D2 |
| | Bx>T3 | By> T1 | B2 |
| | T2<Bx <T3 | By> T1 | E2 |
| | Bx<T2 | By> T1 | F2 |

*FIG. 29*

ASSEMBLY USING A MAGNETIC FIELD SENSOR FOR DETECTING A ROTATION AND A LINEAR MOVEMENT OF AN OBJECT

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors, and more particularly, to an assembly that uses a magnetic field sensor for detecting rotation and a linear movement of a movable object.

BACKGROUND

Various types of magnetic field sensors are known. Some magnetic field sensors are operable to detect a rotation of an object. Other magnetic field sensors are operable to detect a linear movement of an object, whether a straight line movement or a curved motion.

It would be desirable to provide a magnetic field sensor operable to detect both a rotation and a linear movement of an object.

SUMMARY

The present invention provides a magnetic field sensor operable to detect both a rotation and a linear movement of an object.

In accordance with an example useful for understanding an aspect of the present invention, an assembly is oriented in an x, y, z Cartesian coordinate system with an x axis, a y axis and a z axis. The assembly can include a base structure, wherein x, y, z Cartesian coordinate system does not move relative to the base structure. The assembly can further include a rotatable structure moveably disposed with respect to the base structure, wherein the rotatable structure and the base structure are operable to move in a relative movement along a line relative to each other in a direction tangential to the y axis, wherein the rotatable structure is operable to rotate about a rotation axis parallel to the z axis. The assembly can further include a first magnet fixedly coupled to the base structure, the first magnet having north and south poles aligned along a first line stationary with respect to the base structure, the first magnet for generating a first magnetic field. The assembly can further include a second magnet fixedly coupled to the rotatable structure, the second magnet having north and south poles aligned along a second line rotatable with the rotatable structure, the second magnet for generating a second magnetic field. The assembly can further include a magnetic field sensor disposed proximate to the base structure and proximate to the rotatable structure. The magnetic field sensor can include at least one magnetic field sensing element for generating at least one sensing element signal responsive to the first and second magnetic fields at a position of the at least one magnetic field sensing element.

In some embodiments, the above magnetic field sensor can further include a position processor coupled to the at least one sensing element signal and operable to generate a position signal indicative of the at least one predetermined combination of the relative movement along the line and the rotation about the rotation axis.

In accordance with another example useful for understanding another aspect of the present invention, a magnetic field sensor is for sensing a position of an object, the object operable to move in a relative movement along a line relative to another object and to rotate about a rotation axis. The magnetic field sensor can include at least one magnetic field sensing element disposed proximate to the object, the at least one magnetic field sensing element for generating at least one sensing element signal responsive to first and second magnetic fields at a position of the at least one magnetic field sensing element.

In some embodiments, the above magnetic field sensor can further include a position processor coupled to the at least one sensing element signal and operable to generate a position signal indicative of the at least one predetermined combination of the relative movement along the line and the rotation about the rotation axis.

BRIEF DESCRIPTION OF THE DRAWINGS

The foregoing features of the invention, as well as the invention itself may be more fully understood from the following detailed description of the drawings, in which:

FIG. 29 is a truth table showing relationships between the directional magnetic fields of FIGS. 27 and 28 with threshold values and showing corresponding different relative positions of the base structure and of the rotatable structure of FIGS. 9-20;

DETAILED DESCRIPTION

Figure 1:
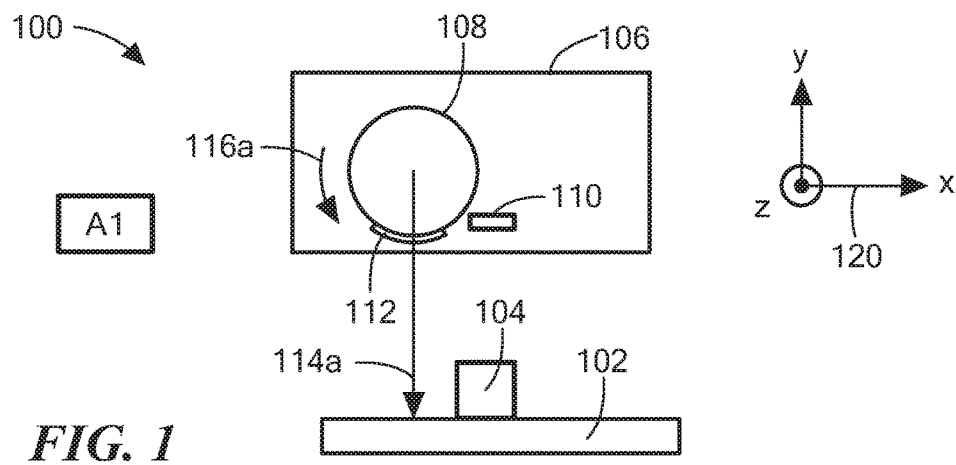
FIGS. 1-6 are pictorial diagrams of an assembly having a base structure and having a rotatable structure operable to move linearly relative to each other at different relative positions of the base structure and of the rotatable structure, wherein the rotatable structure is further operable to rotate about an axis, the assembly also having first and second magnets and having a magnetic field sensor.

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

The terms "parallel" and "perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used.

In some instances, the term "substantially" is used to modify the terms "parallel" or "perpendicular." In general, use of the term "substantially" reflects angles that are beyond manufacturing tolerances, for example, within +/−ten degrees.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

While electronic circuit shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

In particular, it should be understood that a so-called comparator can be comprised of an analog comparator having a two state output signal indicative of an input signal being above or below a threshold level. However the comparator can also be comprised of a digital circuit having an output signal with at least two states indicative of an input signal being above or below a threshold level.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the terms "line" and "linear" are used to describe either a straight line or a curved line. The line can be described by a function having any order less than infinity.

Magnetic field sensors using planar Hall elements, vertical Hall elements and circular vertical Hall (CVH) sensing elements are described in embodiments below. However, it should be understood that other types of magnetic field sensing elements can also be used in similar magnetic field sensors.

Referring now to FIGS. 1-6, in which like elements are shown having like reference designations, an example of an assembly 100, shown in six physical conditions (e.g., positions), also referred to herein as states, labeled by boxes A1, B1, C1, D1, E1, and F1, can be oriented in an x, y, z Cartesian coordinate system 120 with an x axis, a y axis and a z axis. The assembly 100 can include a base structure 102, wherein the x, y, z Cartesian coordinate system 120 does not move relative to the base structure 102.

The assembly 100 can further include a rotatable structure 108. The rotatable structure 108 and the base structure 102 can be operable to move in a relative movement along a line (e.g., a straight or curved line) relative to each other in a direction parallel to or tangential to the y axis. The rotatable structure 108 is also operable to rotate about a rotation axis (out of the page) parallel to the z axis.

The assembly 100 can further include a first magnet 104 fixedly coupled to the base structure 102, the first magnet 104 having north and south poles aligned along a first line stationary with respect to the base structure 102. The first magnet 104 is for generating a first magnetic field described more fully in conjunction with other figures below. In some embodiments, the first magnet 104 has a rectangular or square shape as shown. However, other shapes are possible.

In some embodiments, a line between north and south poles of the first magnet 104 is aligned parallel to the x-axis. However, other alignments of the north and south poles of the first magnet 104 are possible.

The assembly 100 can further include a second magnet 112 fixedly coupled to the rotatable structure 108, the second magnet 112 having north and south poles aligned along a second line rotatable with the rotatable structure 108. The second magnet 112 is for generating a second magnetic field described more fully in conjunction with other figures below. In some embodiments, the second magnet 112 is curved as shown. However, other shapes are possible.

In some embodiments, a line between north and south poles of the second magnet 112 is radially aligned relative to the rotatable structure 108. However, other alignments of the north and south poles of the second magnet 112 are possible.

The assembly 100 can further include a magnetic field sensor 110 disposed proximate to the base structure 102 and proximate to the rotatable structure 108. In some embodiments, the magnetic field sensor 110 can be fixedly coupled to the rotatable structure 108 (e.g., coupled to a structure 106), but does not rotate.

The magnetic field sensor 110 can include at least one magnetic field sensing element (shown in figures below) for generating at least one sensing element signal responsive to the first and second magnetic fields (i.e., responsive to a vector sum of the magnetic fields) at a position of the at least one magnetic field sensing element in the magnetic field sensor 110. In some embodiments, the magnetic field sensor 110 can also include a position processor (shown in figures below) coupled to the at least one sensing element signal and operable to generate a position signal (See, e.g., FIGS. 30 and 31) indicative of at least one predetermined combination of the relative movement along the line and the rotation about the rotation axis Referring to FIG. 1 in particular, the assembly 100 can have a first physical condition labeled by the box A1 here and in figures below for which the rotatable structure 108 and the base structure 102 are relatively far apart along a line 114a parallel to or tangential to the y axis. A first rotation angle of the rotatable structure 108 is indicated by an arrow 116a.

Figure 2:
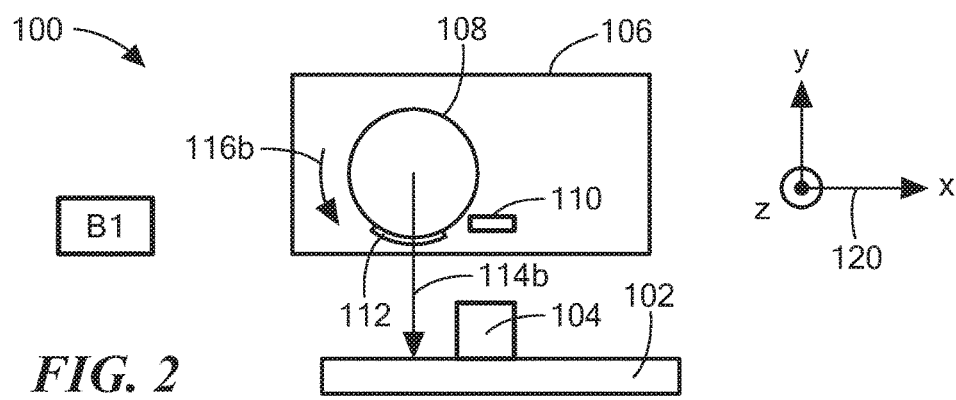

Referring now to FIG. 2, the assembly 100 can have a second physical condition labeled by the box B1 here and in figures below for which the rotatable structure 108 and the base structure are closer together along a line 114b parallel to or tangential to the y axis. A second rotation angle of the rotatable structure 108 is indicated by an arrow 116b, and can, for example, be the same rotation as the first rotation angle 116a.

Figure 3:
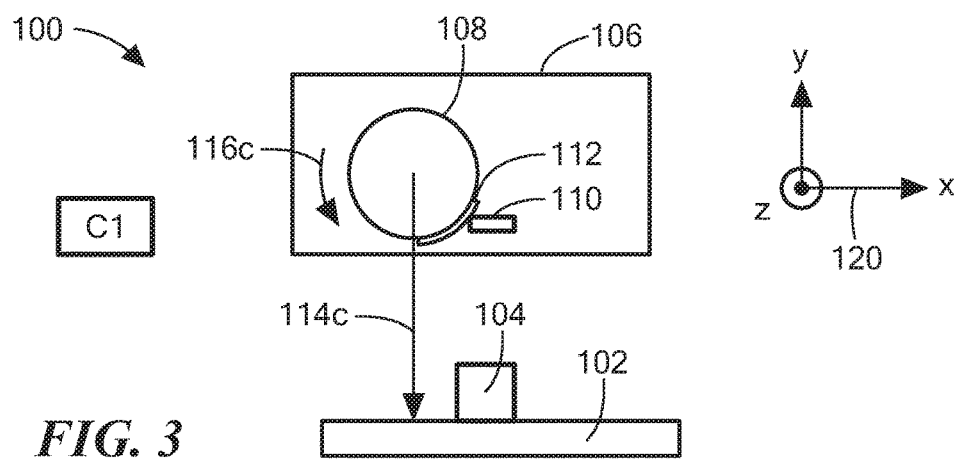

Referring now to FIG. 3, the assembly 100 can have a third physical condition labeled by the box C1 here and in figures below for which the rotatable structure 108 and the base structure 102 are now further apart along a line 114c parallel to or tangential to the y axis, as may occur, for example, due to a mechanical disturbance such as a bump in a moving automobile. A third rotation angle of the rotatable structure 108 is indicated by an arrow 116c and can be different than the first and second rotation angles 116a, 116b. In the third physical condition, the rotatable structure 108 may have begun to rotate about the z axis as shown.

Figure 4:
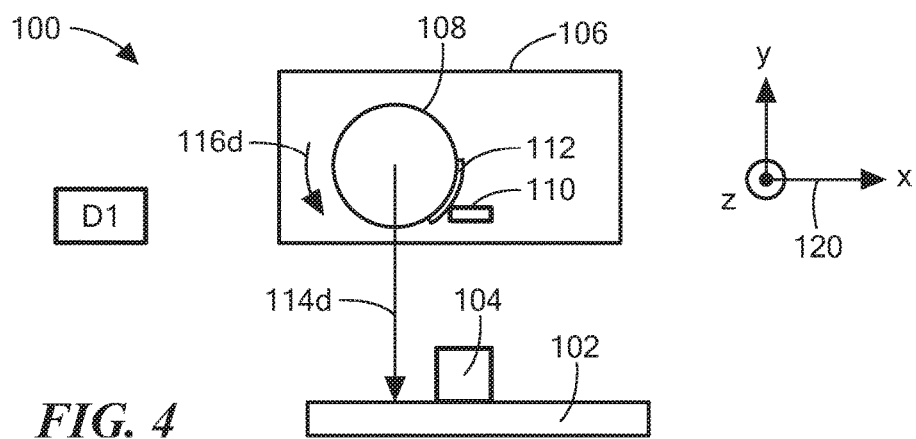

Referring now to FIG. 4, the assembly 100 can have a fourth physical condition labeled by the box D1 here and in figures below for which the rotatable structure 108 and the base structure 102, as in FIG. 3, are further apart along a line 114d parallel to or tangential to the y axis, and for which the rotatable structure 108 has fully rotated about the z axis to a rotation angle indicated by an arrow 116d.

In view of the above, the assembly 100 can take on conditions A1, B1, C1, and D1 in sequence, which may be undesirable. However, in conjunction with FIG. 7 below, an alternative sequence can be achieved when the above-described mechanical disturbance is detected, in which case, the sequence of physical conditions can be A1, B1, C1, A1.

Figure 5:
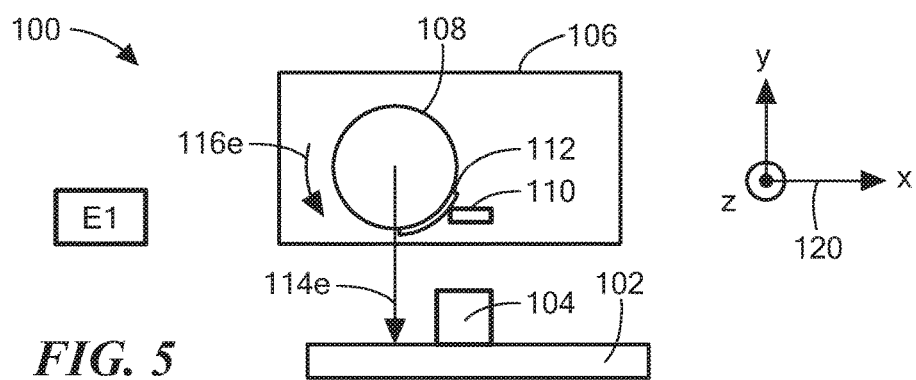

Referring now to FIG. 5, in contrast to the conditions identified by boxed C1 and D1, during a desirable condition after the condition identified by the box B1, the assembly 100 can have a fifth physical condition labeled by the box E1 here and in figures below for which the rotatable structure 108 and the base structure 102 remain close together along a line 114e parallel to or tangential to the y axis as in FIG. 2. Essentially, there has been no bump to cause the assembly 100 in the third physical condition at the box labeled C1. In the fifth physical condition at the box labeled E1, the rotatable structure 108 may have begun to rotate about the z axis indicated by a line 116e.

Figure 6:
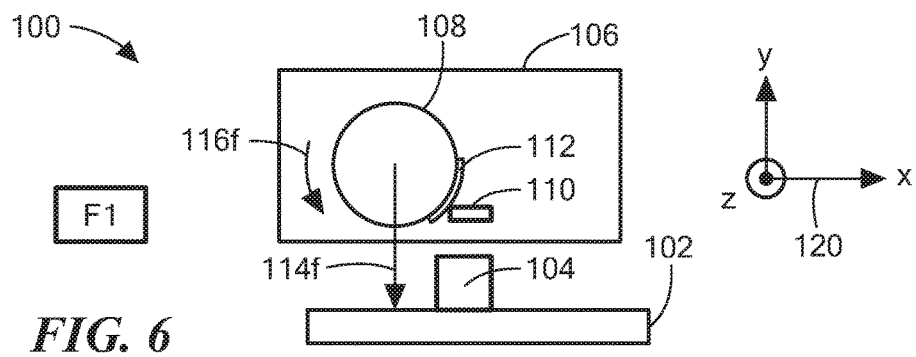

Referring to FIG. 6, the assembly 100 can have a sixth physical condition labeled by the box F1 here and in figures below for which the rotatable structure 108 and the base structure 102, as in FIG. 5, remain close together along a line 114f parallel to or tangential to the y axis. In the sixth physical condition at the box labeled F1, the rotatable structure 108 has fully rotated about the z axis as indicated by a line 116f.

In view of the above, the assembly 100 can take on conditions identified by boxes A1, B1, E1, and F1 in sequence, which may be desirable. In particular, detection of the conditions identified by the box F1 may be indicative of a desirable condition.

It will become apparent from discussion below that the first magnet 104 in combination with the second magnet 112, which can rotate with the rotatable structure 108, can result in a magnetic field at a position of the magnetic field sensor 110 that can change both angle and amplitude depending upon the six conditions labeled A1, B1, C1, D1, E1, and F1. Thus, the magnetic field sensor 110, which can be one and only one magnetic field sensor, can detect not only relative position of the rotatable structure 108 to the base structure 102 along a line parallel to or tangential to the y axis, but, at the same time, can also detect a rotation of the rotatable structure 108 about the z axis.

In general, the magnetic field sensor 110 can detect at least one predetermined combination of the relative movement along the line and the rotation about the rotation axis. In some embodiments, the magnetic field sensor 110 can detect a plurality of predetermined combinations of the relative movement along the line and the rotation about the rotation axis.

In some alternate embodiments, there can be more than or fewer than the six physical conditions A1, B1, C1, D1, E1, F1, and they can be different physical conditions representative of different combinations of linear movement and rotation of the rotatable structure 108.

Figure 7:
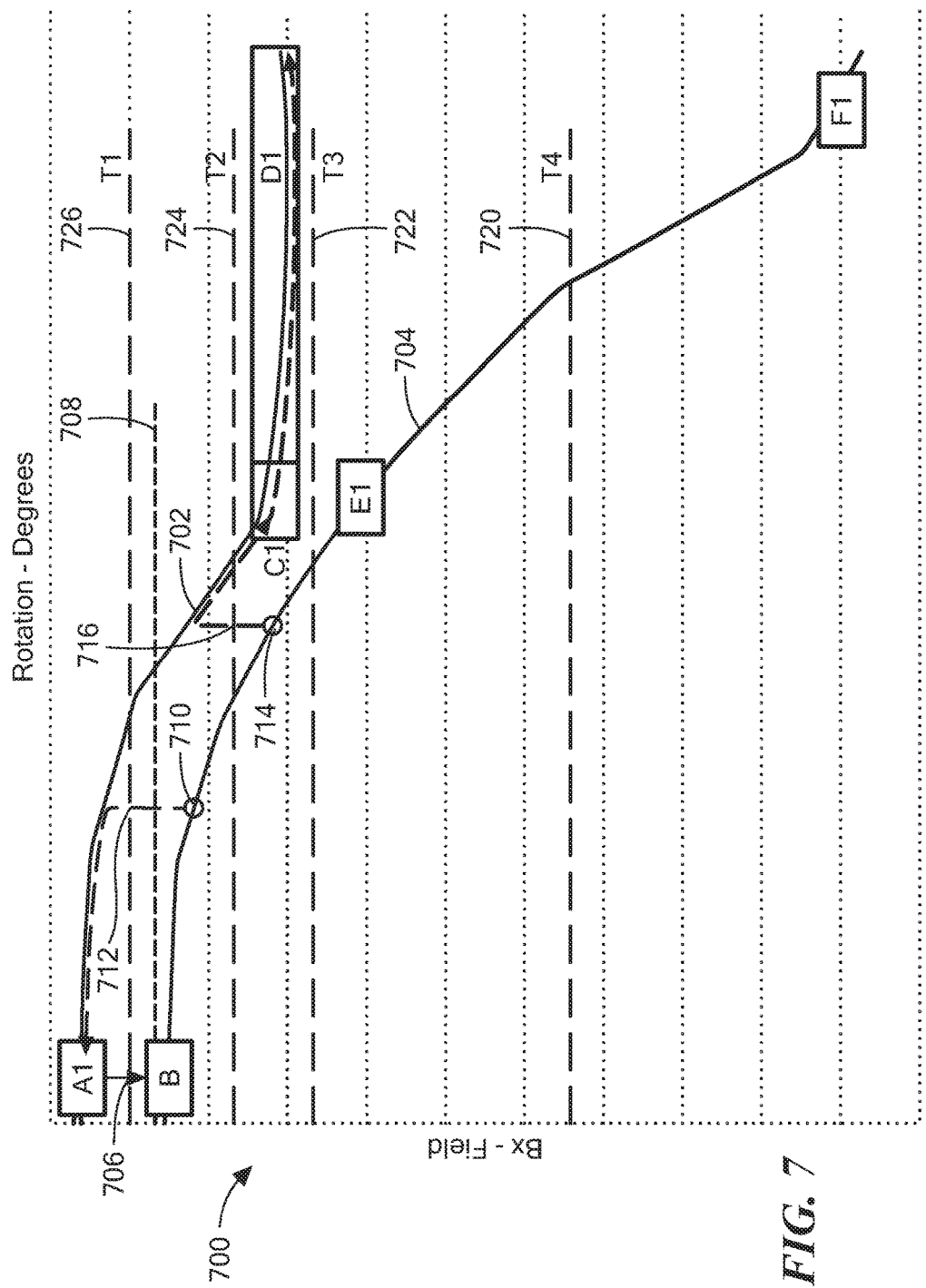
FIG. 7 is a graph showing an amplitude of a magnetic field experienced at a location of the magnetic field sensors of FIGS. 1-6 and at the different relative positions and rotations of FIGS. 1-6.

Referring now to FIG. 7, a graph 700 has a vertical axis with a sale in units of magnetic field in Gauss, wherein the magnetic field is an x projection of a vector sum of magnetic fields at a position of the magnetic field sensor 110 of FIGS. 1-6 as may be measured by the magnetic field sensor 110 of FIGS. 1-6. The graph 700 also has a horizontal axis with a scale in units of rotation angle in degrees, wherein the rotation angle is a rotation angle of the rotatable structure 108 of FIG. 1 about the z axis of FIG. 1.

Boxes A1, B1, C1, D1, E1, and F1 of FIG. 7 are indicative of elements of FIGS. 1-6 at the same physical conditions identified by boxes A1, B1, C1, D1, E1, F1 of FIGS. 1-6.

A curve 702 is indicative of a progression from among the physical conditions identified by boxes A1, B1, C1, D1. As described above, the physical conditions identified by the boxes C1 and D1 may be undesirable.

A curve 704 is indicative of a progression from among the physical conditions identified by boxes A1, B1, E1, and F1. As described above, the physical conditions identified by the boxes E1 and F1 may be desirable.

Though the graph 700 has a vertical axis in units indicative of an x projection of a magnetic field at a position of the magnetic field sensor 110, it should be appreciated that the vertical axis could instead be indicative of an output voltage from a Hall element, for example, a planar Hall element within the magnetic field sensor 110 of FIGS. 1-6, having an axis of maximum sensitivity parallel to the x axis. The planar Hall element responds to magnetic fields in accordance with an x projection of magnetic fields that it experiences.

Thresholds 720, 722, 724, 726 can be used in conjunction with FIG. 8 below to identify the predetermined physical condition identified by the boxes labeled A1, B1, C1, D1, E1, and F1. While particular threshold values are shown, other threshold values can also be used, including additional threshold values.

A threshold magnetic field 708 (i.e., a threshold voltage from the Hall element) can be used to identify a mechanical disturbance in the various physical conditions identified by the blocks A1, B1, C1, D1, E1, and F1. The threshold 726 could be used for the same purpose. For example, when a first transition 706 from the physical condition identified by the block A1 to a physical condition identified by the block B1 occurs, the x projected magnetic field (and the corresponding Hall element output signal) crosses the threshold 708 in a first direction. At a point 710, if a mechanical disturbance occurs, the rotatable structure 108 of FIGS. 1-6 may move away from the base structure 102 and the x projected magnetic field at the magnetic field sensor 110 may take a path 712, crossing the threshold 708 in a second different direction. If the magnetic field sensor 110 detects the transition 712, a processor coupled to the apparatus 100 can revert to the physical condition identified by the box labeled A1. The apparatus can then attempt again to follow the desirable conditions identified by blocks A1, B1, E1, and F1.

At a point 714, if a mechanical disturbance occurs, the rotatable structure 108 may move away from the base structure 102 and the x projected magnetic field at the magnetic field sensor 110 may take a path 716, which does not cross the threshold 708 in the second different direction, in which case, the assembly 100 eventually arrives at the undesirable condition identified by the box D1. Upon arriving at the condition identified by the block D1, it should be understood that the magnetic field sensor 110 can identify this condition because a signal generated by the Hall element within the magnetic field sensor 110 has not crossed the threshold 720.

Figure 8:
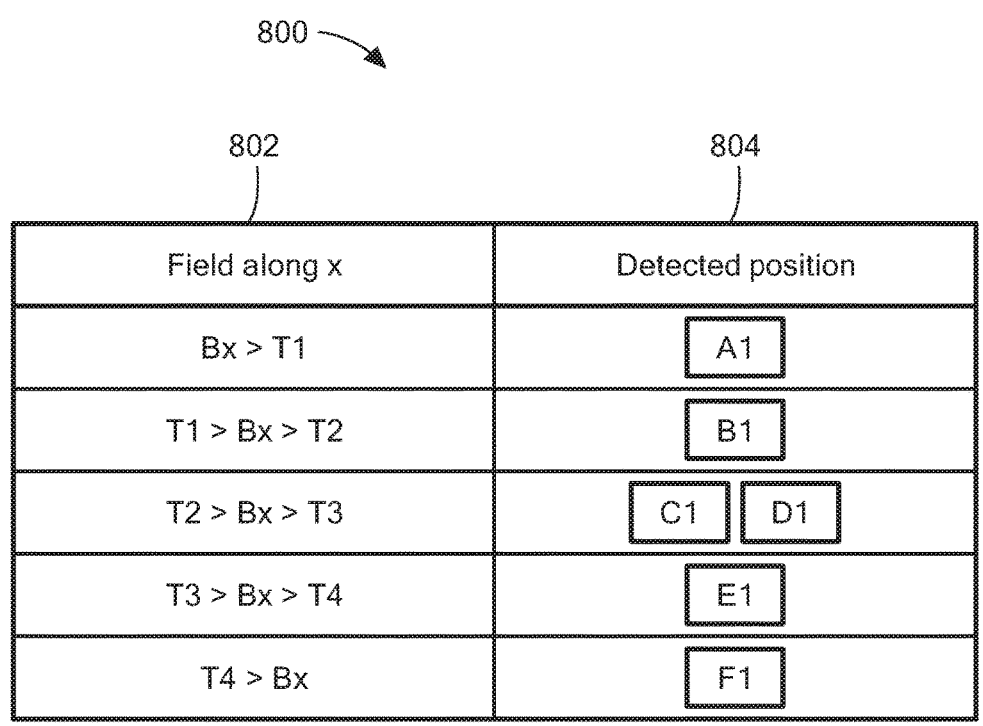
FIG. 8 is a truth table showing relationships between a rotating magnetic field along an x direction of FIGS. 1-6 with threshold values and showing corresponding different relative positions and rotations of the base structure and of the rotatable structure of FIGS. 1-6.
Figure 9:
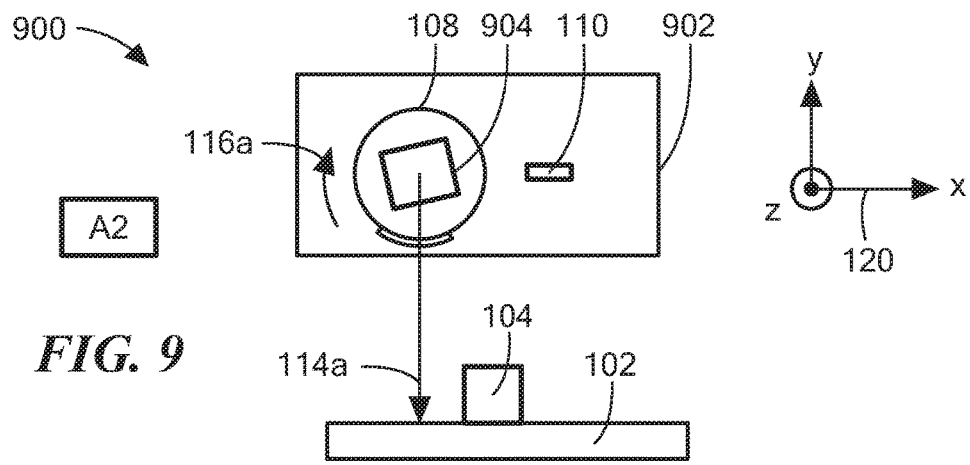
FIGS. 9-14 are pictorial diagrams of another assembly having a base structure and having a rotatable structure operable to move linearly relative to each other at different relative positions of the base structure and of the rotatable structure, wherein the rotatable structure is further operable to rotate about an axis, the assembly also having first and second magnets and having a magnetic field sensor.
Figure 10:
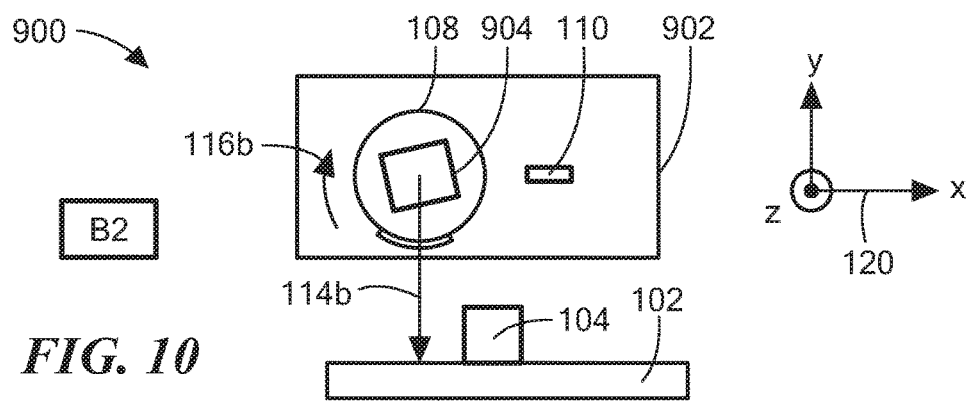
Figure 11:
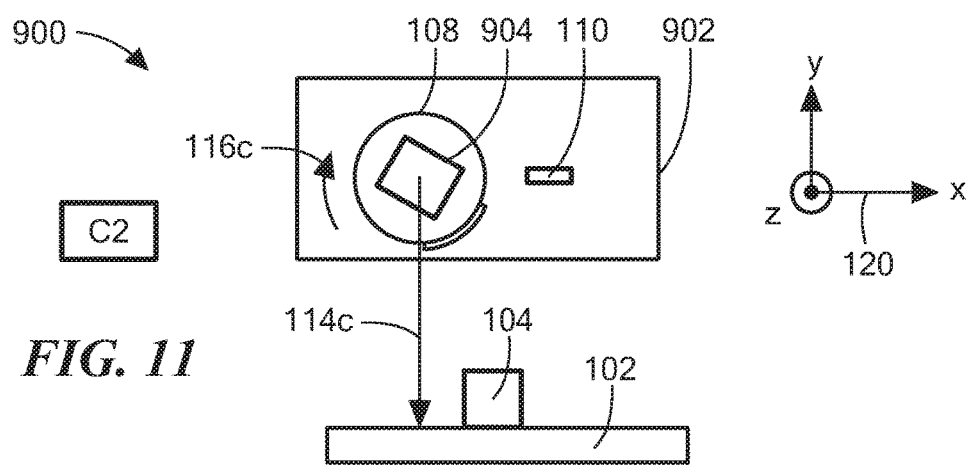
Figure 12:
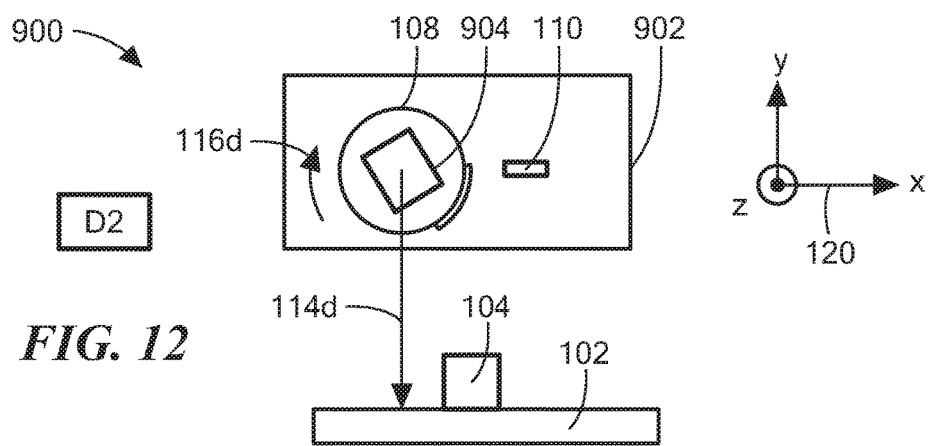
Figure 13:
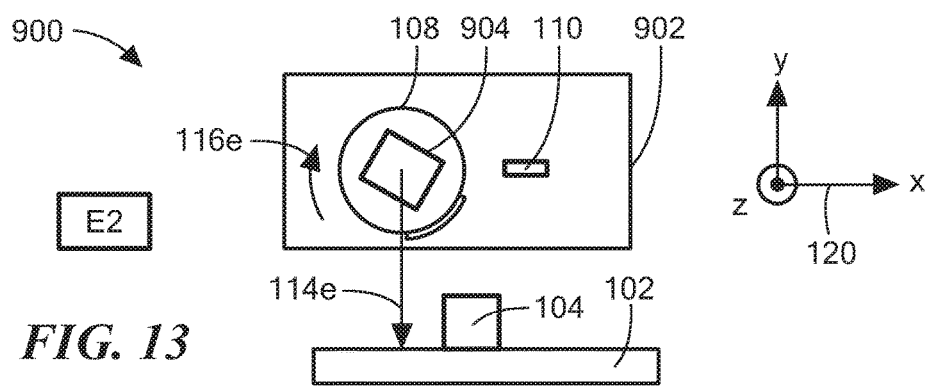
Figure 14:
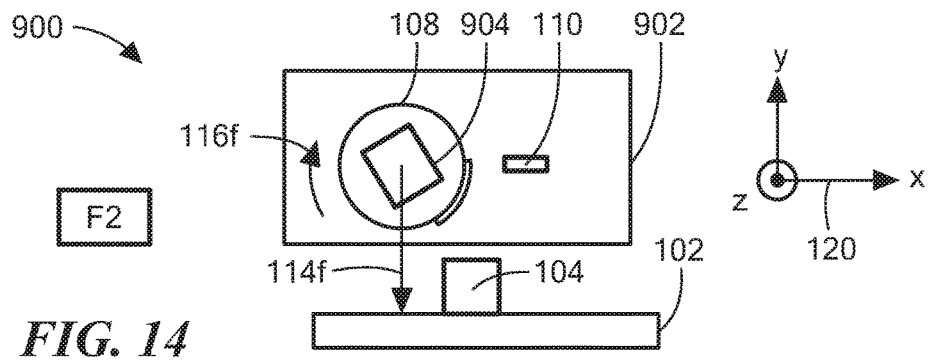

A variety of logic can be used to identify if the desirable condition identified by the block F1 has or has not been achieved (see also FIG. 8). For example, a time threshold can be used to indicate that the desirable condition has not been achieved prior to a threshold time after initiation of movement represented in boxes A1, B1, C1, D1, E1, and F1, for example, three seconds. Alternatively, a rotation detector (not shown) can determine when the rotatable structure 108 has rotated about the z axis by an amount sufficient to achieve the condition identified by the blocks D1 or F1, and the magnetic field sensor 110 can detect that the threshold 720 has not been crossed, thus the undesirable condition identified by the block D1 has been achieved instead of the desirable condition identified by the block F1. The apparatus can then revert to the condition labeled by box A.

While a particular threshold value 708 is shown, other threshold values can also be used for the above-described purpose.

The magnetic field sensor, e.g., the magnetic field sensor 100 of FIGS. 1-6 and a magnetic field sensors 3100, 3200 of FIGS. 31 and 32, respectively, described below can provide an output signal having values in accordance with values of the graph 700. In some embodiments, another processor to which the magnetic field sensor 100 is coupled can make a determination of in which of the conditions identified by boxes A1, B1, C1, D1, E1, and F1 the assembly of FIGS. 1-6 is in.

In other embodiments, the magnetic field sensor (see, e.g., FIGS. 31, 32) can include a position processor operable to make the above determination and provide a signal indicative of the determination.

Referring now to FIG. 8, a table 800 has a first column 802 indicative of amplitudes of x projections of a vector sum (see below) of a magnetic field experienced by the magnetic field sensor 110 of FIGS. 1-6 as compared with the first, second, third, and fourth thresholds 726, 724, 722, 720, respectively, of FIG. 7.

The table 800 has a second column 802 indicative of the above described physical conditions of the assembly 100 of FIGS. 1-6 represented by the boxes A1, B1, C1, D1, E1, F1.

Referring now to FIGS. 9-14, in which like elements are showing having like reference designations, an example of an assembly 900, shown in six physical conditions (e.g., positions), also referred to herein as states, labeled by boxes A2, B2, C2, D2, E2, and F2 can be oriented in the same x, y, z Cartesian coordinate system 120 with an x axis, a y axis and a z axis. The assembly 900 can include the base structure 102, wherein the x, y, z Cartesian coordinate system 120 does not move relative to the base structure 102.

The assembly 900 can further include the rotatable structure 108. The rotatable structure 108 and the base structure 102 can be operable to move in a relative movement along a line (e.g., a straight or curved line) relative to each other in a direction parallel to or tangential to the y axis. The rotatable structure 108 an also operable to rotate about a rotation axis (out of the page) parallel to the z axis.

It should be apparent that the rotatable structure 108 can rotate in a direction opposite to directions of rotation indicated in conjunction with FIGS. 1-6.

The assembly 900 can further include the first magnet 104 fixedly coupled to the base structure 102, the first magnet 104 having north and south poles aligned along a first line stationary with respect to the base structure 102. The first magnet 104 is for generating a first magnetic field described more fully in conjunction with other figures below. In some embodiments, the first magnet 104 has a rectangular or square shape as shown. However, other shapes are possible.

The assembly 900 can further include a second magnet 904 fixedly coupled to the rotatable structure 108, the second magnet 904 having north and south poles aligned along a second line rotatable with the rotatable structure 108. The second magnet 904 is for generating a second magnetic field described more fully in conjunction with other figures below. In some embodiments, the second magnet 904 has a solid rectangular shape as shown. However, other shapes are possible.

While the second magnet 112 of FIGS. 1-6 can be disposed upon or near an outer perimeter of the rotatable structure 108, the second magnet 904 can be disposed at or near to a center of rotation of the rotatable structure 108.

The assembly 900 can further include the magnetic field sensor 110 disposed proximate to the base structure 102 and proximate to the rotatable structure 108. In some embodiments, the magnetic field sensor 110 can be fixedly coupled to the rotatable structure 108 (e.g., coupled to a structure 106), but does not rotate.

The magnetic field sensor 110 can include at least one magnetic field sensing element (shown in figures below) for generating at least one sensing element signal responsive to the first and second magnetic fields (i.e., responsive to a vector sum of the magnetic fields) at a position of the at least one magnetic field sensing element in the magnetic field sensor 110. In some embodiments, the magnetic field sensor 110 can also include a position processor (shown in figures below) coupled to the at least one sensing element signal and operable to generate a position signal (See, e.g., FIGS. 32-34) indicative of at least one predetermined combination of the relative movement along the line and the rotation about the rotation axis.

Further details of FIGS. 9-14 will be understood from discussion above in conjunction with FIGS. 1-6 above and FIGS. 15-20 below. However, the six physical conditions (e.g., positions), also referred to herein as states, labeled by boxes A2, B2, C2, D2, E2, and F2 can rotate in a direction opposite to rotation of the states A1, B1, C1, D1, E1, and F1 of FIGS. 1-6.

In some alternate embodiments, there can be more than or fewer than the six physical conditions A2, B2, C2, D2, E2, F2, and they can be different physical conditions representative of different combinations of linear movement and rotation of the rotatable structure 108.

Referring now to FIGS. 15-20 in which like elements are shown having like reference designations, a partial assembly 1500 can include a first magnet 1502 with north and south poles aligned along the x axis, a second magnet 1504 with north and south poles rotatably disposed, and a magnetic field sensor 1506. An alternate magnetic field sensor 1516 is also shown.

The first magnet 1502 is the same as or similar to the first magnet 104 of FIGS. 9-14. The second magnet 1504 is the same as or similar to the second magnet 904 of FIGS. 9-14. The magnetic field sensors 1506, 1516 are both the same as or similar to the magnetic field sensor 110 of FIGS. 9-14.

FIGS. 15-20 are indicative of the above elements at the same physical conditions identified by boxes A2, B2, C2, D2, E2, F2 of FIGS. 9-14, and the same boxes A2, B2, C2, D2, E2, F2 are also shown in FIGS. 15-20.

A Cartesian coordinate system 1526 has an x axis, a y axis, and a z axis. The Cartesian coordinate system 1526 has the same orientation relative to the first magnet 1502 as the Cartesian coordinate system 120 relative to the first magnet 104 of FIGS. 1-6 and 9-14. The same is true for all figures herein though not explicitly stated in conjunction with other figures below.

The magnetic field sensor 1506 has leads 1508 which are in an x-y plane of a Cartesian coordinate system 1526. Accordingly, a semiconductor substrate described below within the magnetic field sensor 1506 can have major surface parallel to the x-y plane. In contrast, the magnetic field sensor 1516 has leads 1518 which are in a y-z plane of the Cartesian coordinate system 1526. Accordingly, a semiconductor substrate described below within the magnetic field sensor 1516 can have major surface parallel to the y-z plane. Significance of the different orientations of the substrates is described more fully below.

While shown in different physical positions, it is intended that the magnetic field sensor 1516 is an alternative magnetic field sensor at a position of the magnetic field sensor 1506.

Figure 15:
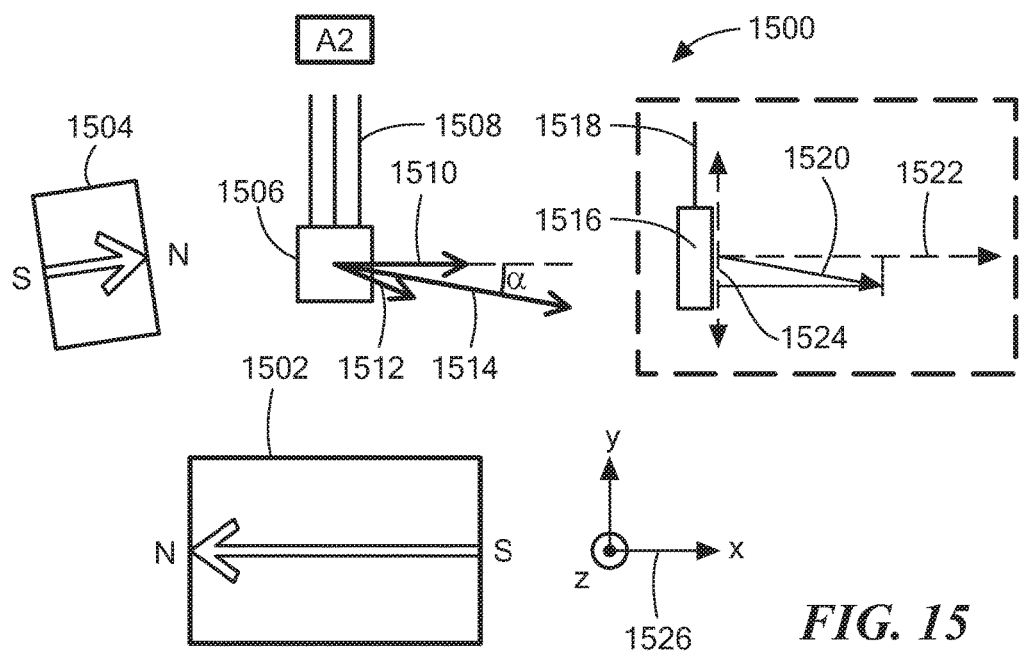
FIGS. 15-20 are pictorial diagrams showing the first and second magnets of FIGS. 9-14, respectively, at the different relative positions and rotations of FIGS. 9-14 and showing two examples of orientations of at least two different types of magnetic field sensors that can be used as the magnetic field sensor of FIGS. 9-14.
Figure 16:
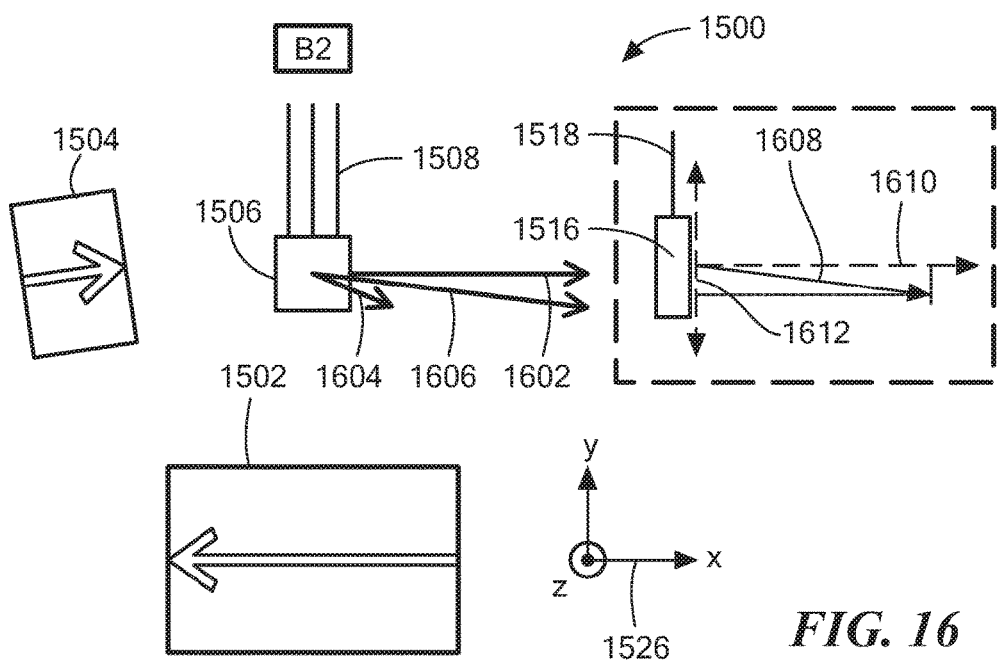
Figure 17:
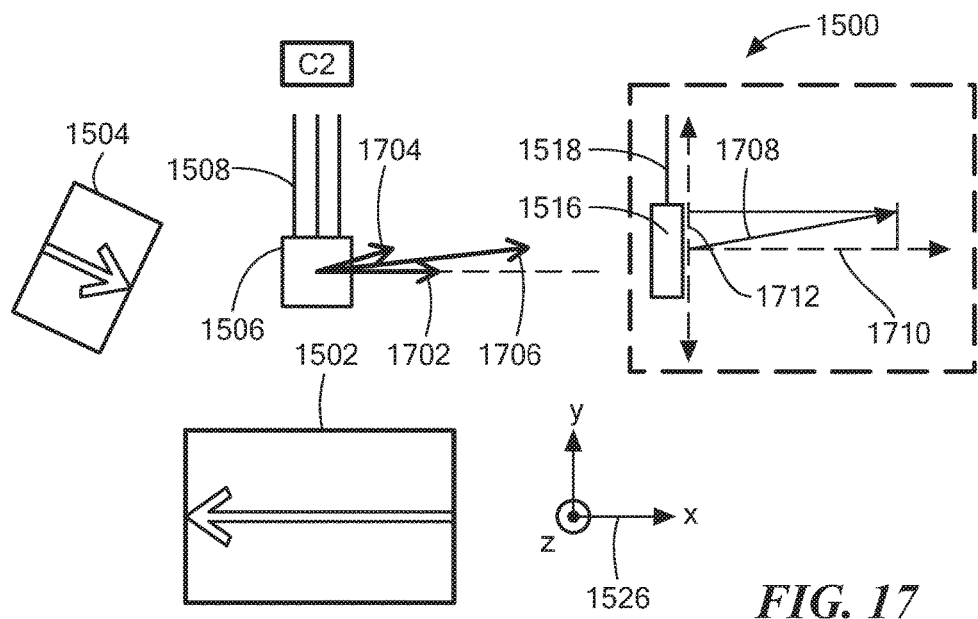
Figure 18:
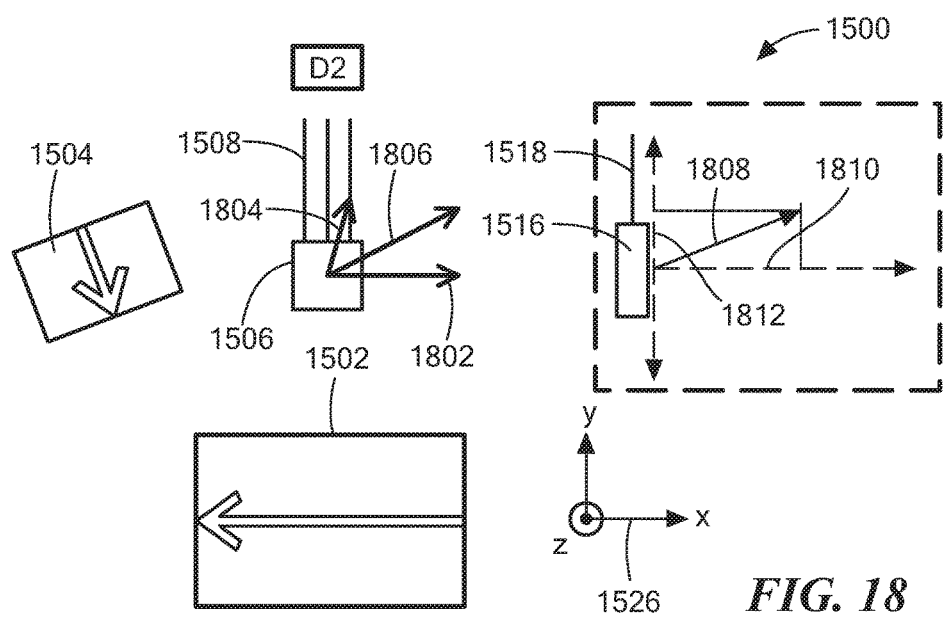
Figure 19:
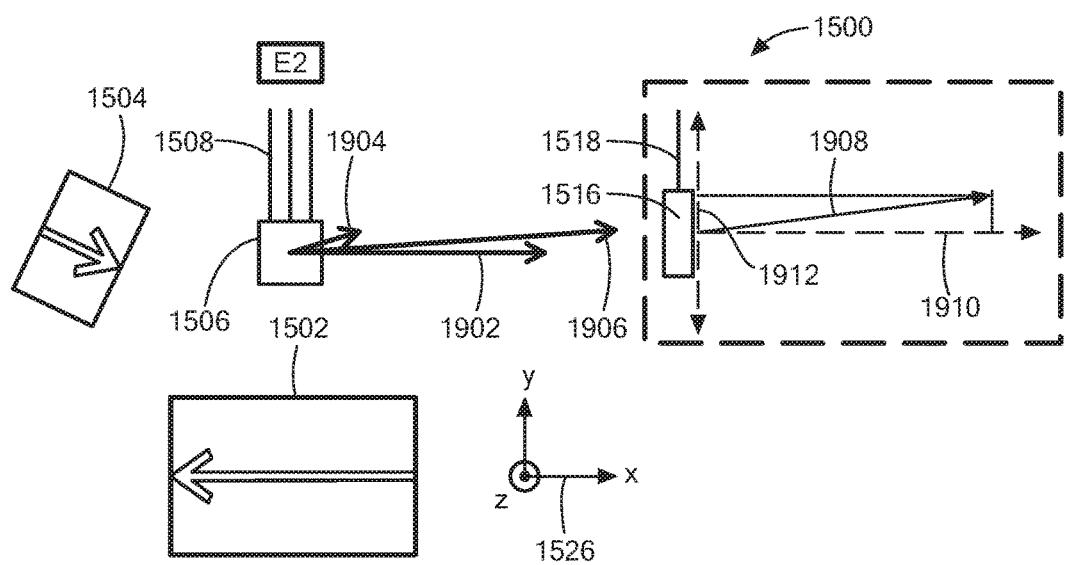
Figure 20:
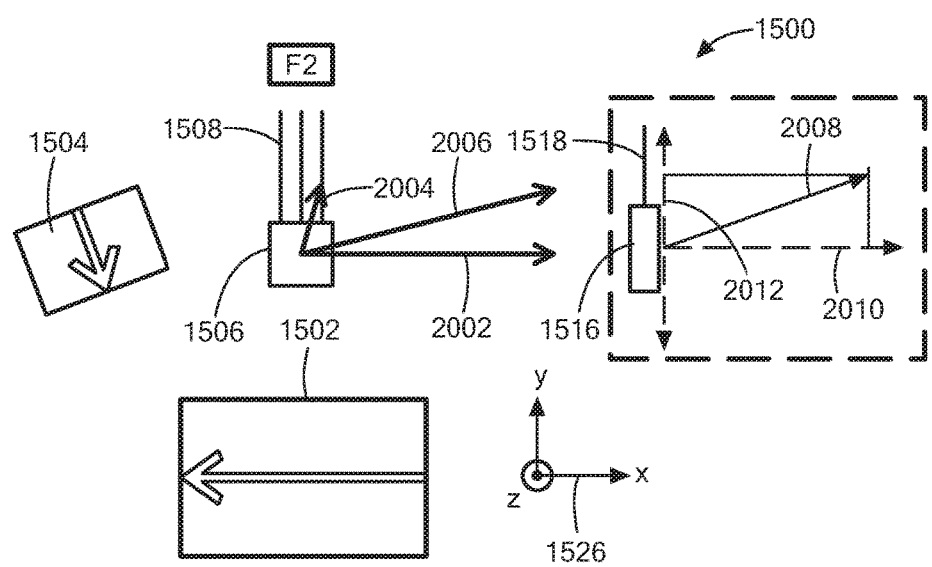

Referring now to FIG. 15, the first magnet 1502 has magnetic field lines that exit the first magnet 1502 at the north pole and return at the south pole. Thus, at a position of the magnetic field sensor 1506 (and 1516), i.e., at the condition identified by the box labeled A2, a magnetic field generated by the first magnet 1502 points generally to the right, as represented by a magnetic field line 1510.

The second magnet 1504 has magnetic field lines that exit at the north pole and return at the south pole. Thus, at a position of the magnetic field sensor 1506 (and 1516), i.e., at the condition identified by the box labeled A2, a magnetic field generated by the second magnet 1504 points generally to the right and downward, as represented by a magnetic field line 1512.

A magnetic field line 1514 is indicative of a vector sum of the two magnetic field lines 1510, 1512. The magnetic field line 1514 forms an angle α with respect a line parallel to the x-axis. Some magnetic field sensors described below can detect the angle α. From discussion below, it will be understood that an angle of the vector sum 1514 of magnetic field lines generated by the first and second magnets 1502, 1504, respectively, can be detected by and used by the magnetic field sensor 1506 to identify which one of the six conditions identified by boxes A2, B2, C2, D2, E2, F2 experiences.

Referring alternatively to the magnetic field sensor 1516, a magnetic field line 1520 is the same as the magnetic field line 1514 of the above-described vector sum. Here, however, projections of the magnetic field line 1520 are shown, for example a projection 1522 upon a line parallel to the x axis (referred to herein as a x projection) and a projection 1524 upon a line parallel to the y axis (referred to herein as a y projection). From discussion below, it will be understood that the x projection and the y projection can be used to identify the angle of the vector sum of magnetic field lines generated by the first and second magnets 1502, 1504, respectively. Like the magnetic field sensor 1506, the magnetic field sensor 1516 can also use identified angle to identify which one of the six conditions identified by boxes A2, B2, C2, D2, E2, F2 experiences.

In addition, from discussion below, it will be understood that the x projection 1522 or the y projection 1524, or both, can be used without computing the angle of the magnetic field line 1520 to identify which one of the six conditions identified by boxes A2, B2, C2, D2, E2, F2 experiences.

Referring to FIGS. 15-20, the first magnet 1502 can generate the magnetic field line 1510 at the first condition identified by the box A2, a magnetic field line 1602 at the second condition identified by the box B2, a magnetic field line 1702 at the third condition identified by the box C2, a magnetic field line 1802 at the fourth condition identified by the box D2, a magnetic field line 1902 at the fifth condition identified by the box E2, and a magnetic field line 2002 at the sixth condition identified by the box F2.

The second magnet 1504 can generate the magnetic field line 1512 at the first condition identified by the box A2, a magnetic field line 1604 at the second condition identified by the box B2, a magnetic field line 1704 at the third condition identified by the box C2, a magnetic field line 1804 at the fourth condition identified by the box D2, a magnetic field line 1904 at the fifth condition identified by the box E2, and a magnetic field line 2004 at the sixth condition identified by the box F2.

The magnetic field line 1514 (and 1520) is representative of the above-described vector sum at the first condition identified by the box labeled A2, a magnetic field line 1606 (and 1608) is representative of the a similar vector sum at the second condition identified by the box labeled B2, a magnetic field line 1706 (and 1708) is representative of the a similar vector sum at the third condition identified by the box labeled C2, a magnetic field line 1806 (and 1808) is representative of the a similar vector sum at the fourth condition identified by the box labeled D2, a magnetic field line 1906 (and 1908) is representative of the a similar vector sum at the fifth condition identified by the box labeled E2, a magnetic field line 2006 (and 2008) is representative of the a similar vector sum at the sixth condition identified by the box labeled F2.

It can be seen that angles and magnitudes of the vector sum magnetic field lines 1514 (and 1520), 1606 (and 1608), 1706 (and 1708), 1806 (and 1808), 1906 (and 1908), and 2006 (and 2008) are different at the different conditions identified by the boxes A2, B2, C2, D2, E2, F2. It can also be seen that x projections 1522, 1610, 1710, 1810, 1910, 2010 and y projections 1524, 1612, 1712, 1812, 1912, 2012 are different at the different conditions identified by the boxes A2, B2, C2, D2, E2, F2.

In other embodiments, the north pole and/or and south poles of the first and second magnets 1502, 1504, respectively can be reversed and results similar to those of figures below will still result.

Figure 21:
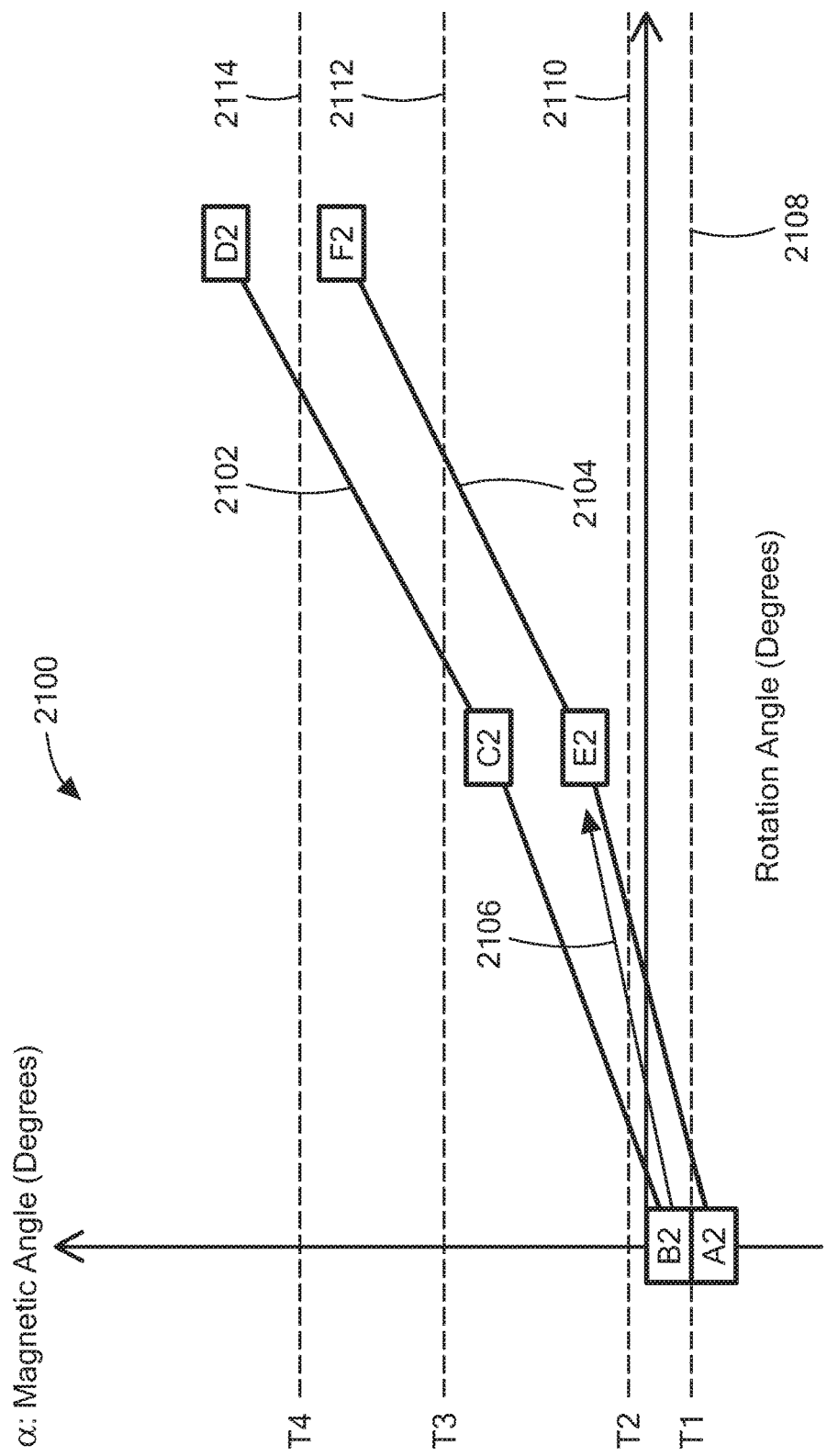
FIG. 21 is a graph showing an angle of a magnetic field experienced at a location of the magnetic field sensors of FIGS. 9-20 and at the different relative positions of FIGS. 9-20.

Referring now to FIG. 21, a graph 2100 has a vertical axis with a sale in units of angle in arbitrary units, wherein the angle corresponds to the angle α of the vector sum (e.g., 1514, 1520 of FIG. 15) of the magnetic fields at the magnetic field sensor 110 of FIGS. 9-14 as may be measured by the magnetic field sensor 1506 or the magnetic field sensor 1516 of FIGS. 15-20. The graph 2100 also has a horizontal axis with a scale in units of rotation angle in degrees, wherein the rotation angle is a rotation angle of the rotatable structure 108 about the z axis of FIGS. 9-14.

A curve 2102 is indicative of a progression from among the physical conditions identified by boxes A2, B2, C2, D2. As described above, the physical conditions identified by the boxes C2 and D2 may be undesirable.

A curve 2104 is indicative of a progression from among the physical conditions identified by boxes A2, B2, E2, and F2. The physical conditions identified by the boxes E and F may be desirable.

The magnetic field sensor 1506 or the magnetic field sensor 1516 of FIGS. 15-20 can identify the angle α and can use thresholds 2108, 2110, 2112, 2114 to identify a sequence of physical conditions identified by boxes A2, B2, C2, D2 or a sequence of physical conditions identified by boxes A2, B2, E2, F2.

A magnetic field sensor, e.g., the magnetic field sensor 1516 of FIGS. 15-20 and a magnetic field sensor 3200 of FIG. 32 or a magnetic field sensor 3300 of FIG. 33, described below can provide an output signal having values in accordance with angle values of the graph 2100. Thus, in some embodiments, another processor to which the magnetic field sensor is coupled can make a determination of in which of the conditions identified by boxes A2, B2, C2, D2, E2, and F2 the assembly of FIGS. 9-14 is in.

In other embodiments, the magnetic field sensor (see, e.g., 3200 of FIG. 32) can include a position processor operable to make the above determination and provide a signal indicative of the determination.

Figure 22:
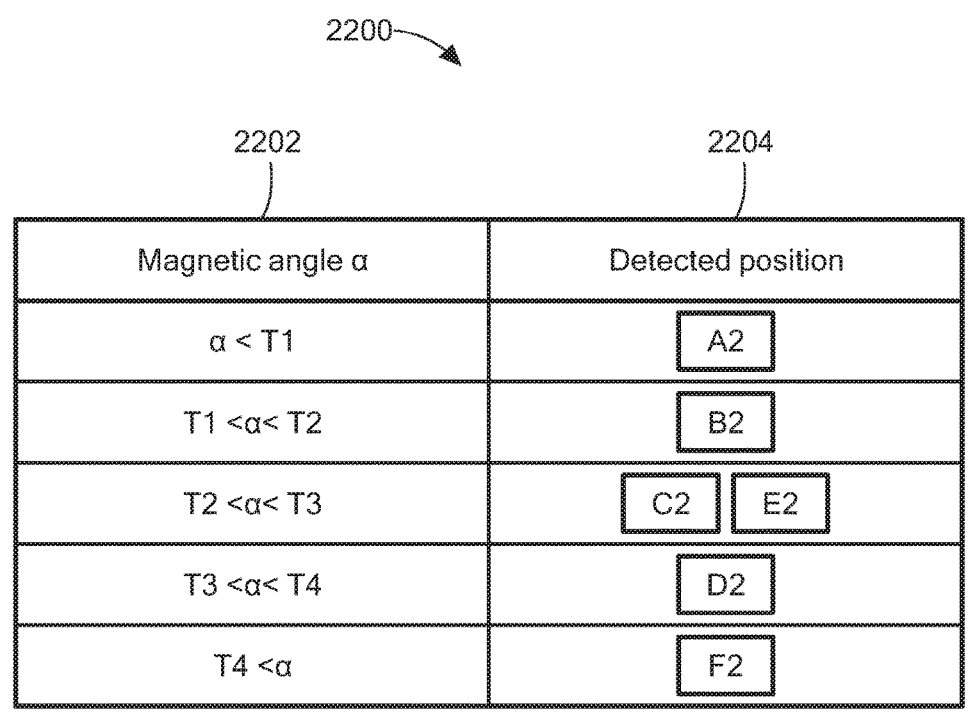
FIG. 22 is a truth table showing relationships between an angle of a magnetic field of FIGS. 9-20 with threshold values and showing corresponding different relative positions and rotations of the base structure and of the rotatable structure of FIGS. 9-20.

Referring now to FIG. 22, a table 2200 has a first column 2202 indicative of amplitudes of an angle of a vector sum (e.g., 1520) of a magnetic field experienced by the magnetic field sensor 1516 of FIGS. 15-20 as compared with the first, second, third, and fourth thresholds 2108, 2110, 2112, 2114, respectively, of FIG. 21.

The table 2200 has a second column 2204 indicative of the above described physical conditions of the assembly 900 of FIGS. 9-14 represented by the boxes A2, B2, C2, D2, E2, F2.

Figure 23:
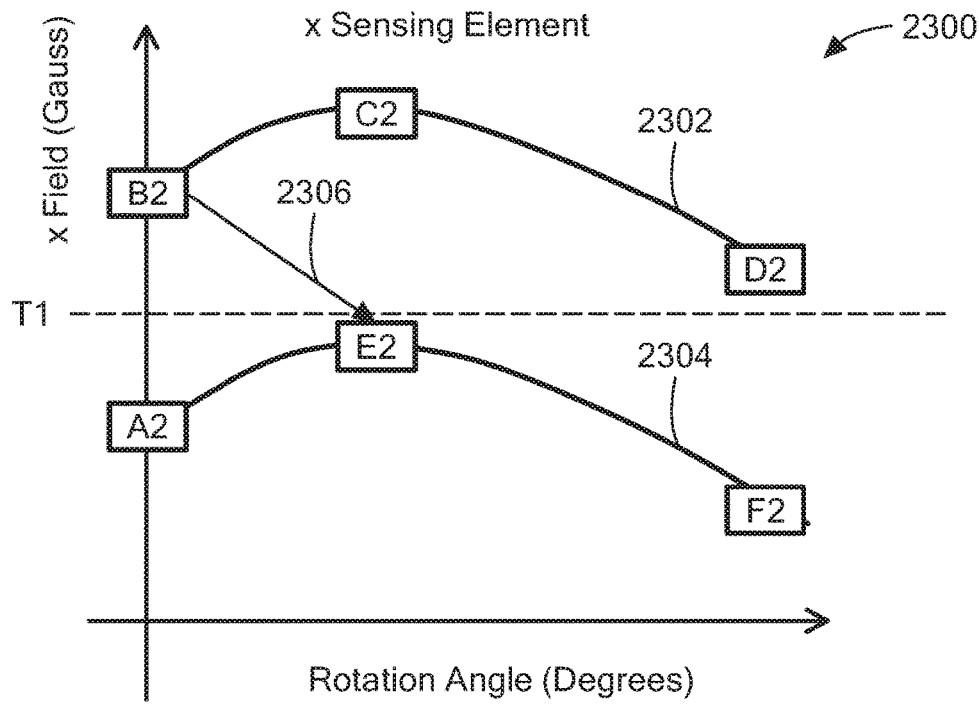
FIG. 23 is a graph showing an amplitude of a magnetic field in an x-direction (i.e., a projection of the magnetic field upon an x-axis) experienced at a location of the magnetic field sensors of FIGS. 9-20, at the different relative positions and rotations of FIGS. 9-20, and using the first and second magnets of FIGS. 9-20.
Figure 24:
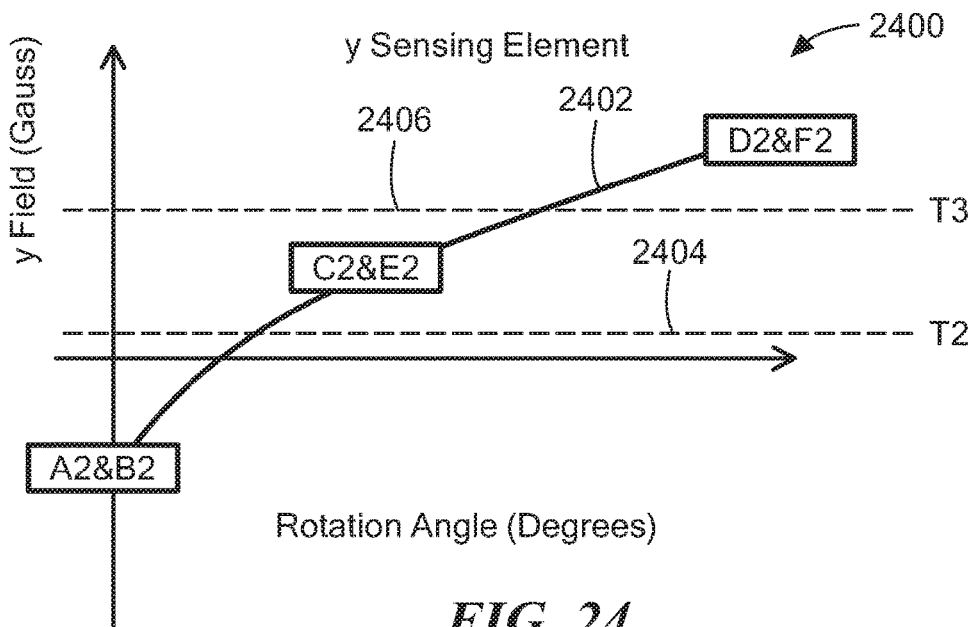
FIG. 24 is a graph showing an amplitude of a magnetic field in a y-direction (i.e., a projection of the magnetic field upon a y-axis) experienced at a location of the magnetic field sensors of FIGS. 9-20, at the different relative positions of FIGS. 9-20, and using the first and second magnets of FIGS. 9-20.

Referring now to FIGS. 23 and 24, a graph 2300 has a vertical axis with a scale in units of magnetic field in arbitrary units, wherein the magnetic field is an x projection of a vector sum (e.g., 1514) of magnetic fields at a position of the magnetic field sensor 110 of FIGS. 9-14 as may be measured by the magnetic field sensor 7110 of FIGS. 9-14. The graph 2300 also has a horizontal axis with a scale in units of rotation angle in degrees, wherein the rotation angle is a rotation angle of the rotatable structure 108 about the z axis of FIGS. 9-14.

Similarly, a graph 2400 has a vertical axis with a scale in units of magnetic field in arbitrary units, wherein the magnetic field is a y projection of a vector sum (e.g., 1514) of magnetic fields at a position of the magnetic field sensor 110 of FIGS. 9-14 as may be measured by the magnetic field sensor 110 of FIGS. 9-14. graph 2400 also has a horizontal axis with a scale in units of rotation angle in degrees, wherein the rotation angle is a rotation angle of the rotatable structure 108 about the z axis of FIGS. 9-14.

Curves 2302, 2402 are indicative of a progression from among the physical conditions identified by boxes A2, B2, C2, and D2. As described above, the physical conditions identified by the boxes C2 and D2 may be undesirable.

A curve 2304 with a curve 2306 is indicative of a progression from among the physical conditions identified by boxes A2, B2, E2, and F2. As described above, the physical conditions identified by the boxes E2 and F2 may be desirable.

The curve 2402 is also indicative of a progression from among the physical conditions identified by boxes A2, B2, E2, and F2. As described above, the physical conditions identified by the boxes E2 and F2 may be desirable.

The magnetic field sensor 1516 of FIGS. 15-20 can identify the x and y projections of the vector sum (e.g., 1520) of the magnetic field experienced by the magnetic field sensor 1516.

Figure 33:
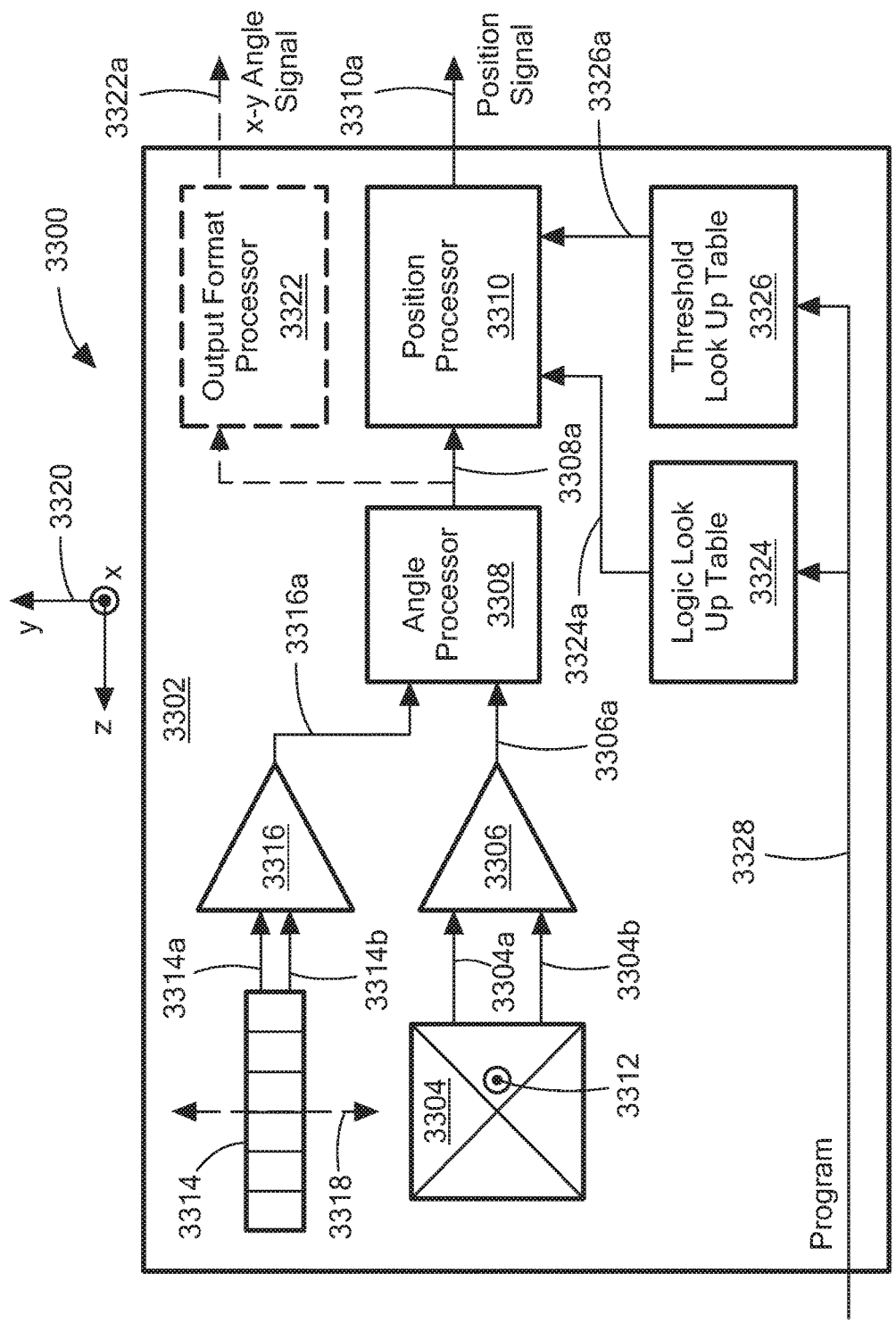
FIG. 33 is a block diagram showing an illustrative embodiment of another magnetic field sensor having both a planar Hall element and a vertical Hall element and also electronic circuits all disposed upon a substrate that can be used as one of the magnetic field sensors of FIGS. 9-20 and that can provide a magnetic field sensor signal representative of the graph of FIG. 21.

First, second, and third thresholds 2308, 2404, 2406, respectively, can be used to identify the sequences of the physical conditions, for example, as identified in conjunction with FIG. 33.

Figures 25, 26:
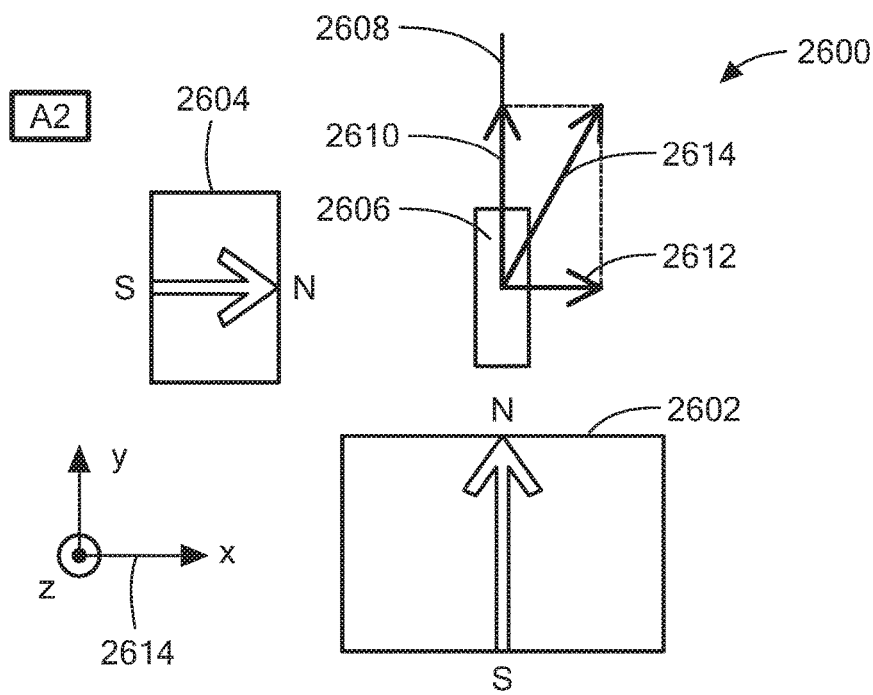
FIG. 25 is a truth table showing relationships between the directional magnetic fields of FIGS. 23 and 24 with threshold values and showing corresponding different relative positions of the base structure and rotations of the rotatable structure of FIGS. 9-20.
FIG. 26 is a pictorial drawing showing the second magnet and a different first magnet than the first magnet of FIGS. 9-20, and also showing a magnetic field sensor.

Referring now to FIG. 25, a table 2500 has a first column 2502 indicative of amplitudes of x projections of a vector sum (e.g., 1520) of a magnetic field experienced by the magnetic field sensor 1516 of FIGS. 15-20 as compared with the first threshold 2308 of FIG. 23.

The table 2500 has a second column 2504 indicative of amplitudes of y projections of the vector sum (e.g., 1520) of the magnetic field experienced by the magnetic field sensor 1516 of FIGS. 15-20 as compared with the second and third thresholds 2404, 2406 of FIG. 24.

The table 2500 has a third column 2506 indicative of the above described physical conditions of the assembly 900 of FIGS. 9-14 represented by the boxes A2, B2, C2, D2, E2, F2.

Referring now to FIG. 26, a partial assembly 2600 can include a first magnet 2602 with north and south poles aligned with the y axis, a second magnet 2604 with north and south poles rotatably disposed, and a magnetic field sensor 2606. Unlike the partial assembly 1500 of FIGS. 15-20, here a line between the north and south poles of the first magnet 2602 is rotated relative to a line between the north and south poles of the first magnet 1502. Thus, results are different from those of FIGS. 15-20 described above.

A magnetic field sensor 2606 can be the same as or similar to the magnetic field sensor 1516 of FIGS. 15-20. The magnetic field sensor 2606 can have leads 2608.

A Cartesian coordinate system 2614 can be the same as or similar to the Cartesian coordinate systems 120, 1526 above.

A magnetic field line 2610 can be representative of a magnetic field generated by the first magnet 2602 at a position of the magnetic field sensor 2606 when an associated assembly is in a condition indicated by the box A2, which is also indicated in FIGS. 9-20.

A magnetic field line 2612 can be representative of a magnetic field generated by the second magnet 2604 at a position of the magnetic field sensor 2606 when an associated assembly is in the condition indicated by the box A2.

Physical conditions of the assemblies and partial assemblies 100, 900, 1400 of FIGS. 1-5 and 9-20 identified by the boxes B2, C2, D2, E2, and F2 are not shown in FIG. 26, but will be understood.

A magnetic field line 2614 is representative of a vector sum of the magnetic field lines 2610, 2612.

Figure 27:
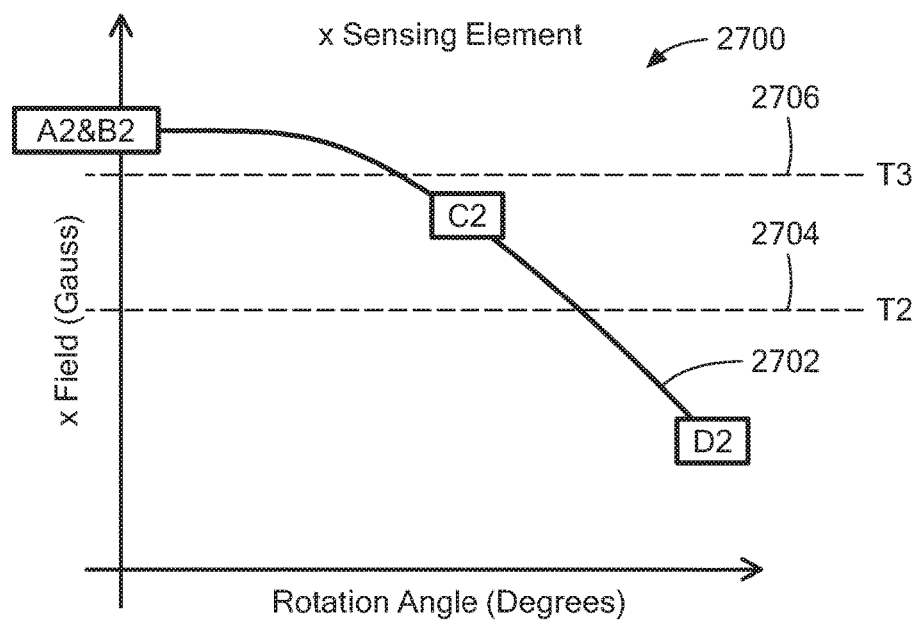
FIG. 27 is a graph showing an amplitude of a magnetic field in an x-direction (i.e., a projection of the magnetic field upon an x-axis) experienced at a location of the magnetic field sensor of FIGS. 9-20 at the different relative positions and rotations of FIGS. 9-20 and using the second magnet and the different first magnet of FIG. 26 when in physical conditions of FIGS. 9-20.
Figure 28:
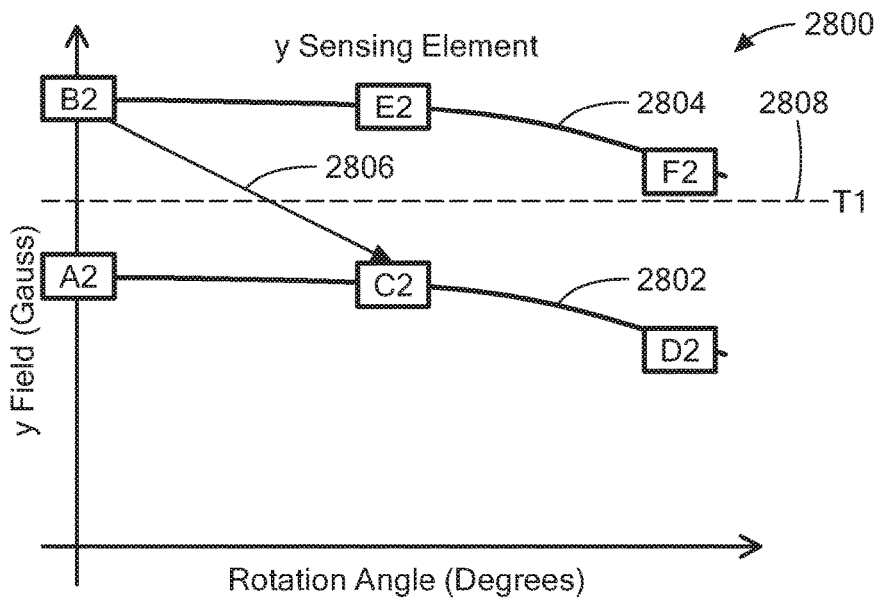
FIG. 28 is a graph showing an amplitude of a magnetic field in a y-direction (i.e., a projection of the magnetic field upon a y-axis) experienced at a location of the magnetic field sensor of FIGS. 9-20 at the different relative positions of FIGS. 9-20 and using the second magnet and the different first magnet of FIG. 26 when in physical conditions of FIGS. 9-20.

Referring now to FIGS. 27 and 28, a graph 2700 has a vertical axis with a sale in units of magnetic field in arbitrary units, wherein the magnetic field is an x projection of a vector sum of magnetic fields at a position of a magnetic field sensor as may be measured by the magnetic field sensor 2606 of FIG. 26. The graph 2700 also has a horizontal axis with a scale in units of rotation angle in degrees, wherein the rotation angle is a rotation angle of the second magnet 2604 about the z axis of FIG. 26.

Similarly, a graph 2800 has a vertical axis with a sale in units of magnetic field in arbitrary units, wherein the magnetic field is a y projection of a vector sum of magnetic fields at a position of a magnetic field sensor as may be measured by the magnetic field sensor 2606 of FIG. 26. The graph 2800 also has a horizontal axis with a scale in units of rotation angle in degrees, wherein the rotation angle is a rotation angle of the second magnet 2604 about the z axis of FIG. 26.

Curves 2702 and 2802 (with 2806) are indicative of a progression from among the physical conditions identified by boxes A2, B2, C2, D2. As described above, the physical conditions identified by the boxes C2 and D2 may be undesirable.

A curve 2804 is indicative of a progression from among the physical conditions identified by boxes A2, B2, E2, and F2. As described above, the physical conditions identified by the boxes E2 and F2 may be desirable.

The magnetic field sensor 2606 of FIG. 26 can identify x and y projections 2612, 2610, respectively, of the vector sum 2614 of the magnetic field experienced by the magnetic field sensor 2606.

First, second, and third thresholds 2808, 2704, 2706, respectively, can be used to identify a physical condition or a sequences of the physical conditions, for example, as identified below in conjunction with FIG. 29.

Referring now to FIG. 29, a table 2900 has a first column 2902 indicative of amplitudes of x projections of the vector sum of the magnetic field experienced by the magnetic field sensor 2606 of FIG. 26 as compared with the second and third thresholds 2704, 2706 of FIG. 27.

The table 2900 has a second column 2904 indicative of amplitudes of y projections of the vector sum of the magnetic field experienced by the magnetic field sensor 2606 of FIG. 26 as compared with the first threshold 2808 of FIG. 28.

The table 2900 has a third column 2906 indicative of the above described physical conditions of the assembly 900 of FIGS. 9-14 represented by the boxes A2, B2, C2, D2, E2, F2 used in other figures herein.

FIGS. 30-34 below show various illustrative examples of magnetic field sensors disposed with respective substrates oriented in illustrative ways in the same xyz Cartesian coordinate system of figures above. In FIGS. 30-34, analog-to-digital circuits (ADCs) and digital-to-analog (DACs) are not shown, but can be used to convert between analog and digital circuits, as will be understood.

Figure 30:
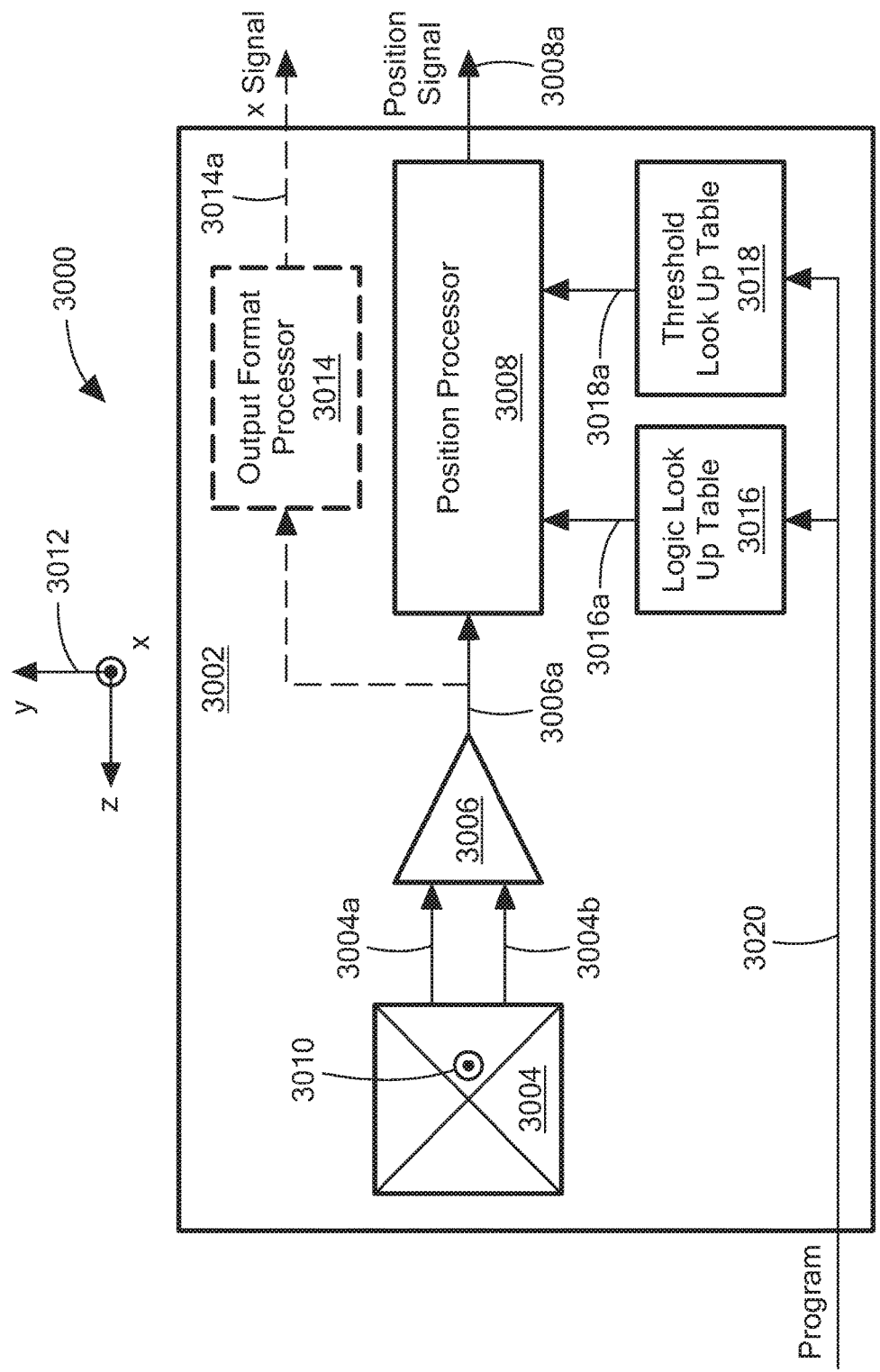
FIG. 30 is a block diagram showing an illustrative embodiment of a magnetic field sensor having a planar Hall element and electronic circuits all disposed upon a substrate that can be used as the magnetic field sensors of FIGS. 1-6 and that can provide a magnetic field sensor signal representative of the graph of FIG. 7.

Referring now to FIG. 30, a magnetic field sensor 3000 can be the same as or similar to the magnetic field sensor 110 of FIGS. 1-6 and 9-14 and also the same as or similar to the magnetic field sensor 1516 of FIGS. 15-20. The magnetic field sensor 3000 can be operable to generate signal values represented by the graph 700 of FIG. 7 and indicative of an x projection of a vector sum of magnetic fields.

The magnetic field sensor 3000 can include a substrate 3002 having a major planar surface parallel to a y-z plane of a Cartesian coordinate system 3012, which can be oriented in the same way as or in a similar way as Cartesian coordinate systems described above.

A planar Hall element 3004 can be disposed upon the substrate 3002. The planar Hall 3004 element can have an axis of maximum sensitivity 3010 parallel to the x axis.

The planar Hall element 3004 can generate a differential signal 3004a, 3004b.

While not shown, it should be appreciated that this and all Hall elements described herein, including both planar Hall elements and vertical Hall elements, and also including a CVH sensing element, can employ circuits (not shown) to perform current spinning, also referred to as chopping. Current spinning is a known technique used to reduce a DC offset voltage in an output signal from a Hall element.

An amplifier 3006 can be coupled to receive the differential signal 3004a, 3004b and can be operable to generate an amplified signal 3006a.

A position processor 3008 can be coupled to receive the amplified signal 3006a and can be operable to generate a position signal 3008a indicative at least one of the conditions (i.e., positions) A1, B1, C1, D1, E1, F1 of the assembly 100 of FIGS. 1-6.

The position signal 3008a can be in one of a variety of formats, for example, a SENT format, and I2C format, and a PWM format.

To this end, the magnetic field sensor 3000 can include a logic look up table 3016 to provide logic information 3016a to the position processor 3008, and the magnetic field sensor 3000 can include a threshold look up table 3018 to provide threshold values 3018a. The logic look up table 3016 and the threshold look up table 3018 can be comprised of one or more non-volatile memory devices. In some embodiments, a program signal 3020 can be provided to the logic look up table 3016 and the threshold look up table 3018 from outside of the magnetic field sensor 3000 to store values therein, the stored values particular to an application in which the magnetic field sensor 3000 may be used.

In some embodiments, the position processor 3008 can use the logic information 3016a and the threshold values 3018a according to the graph 700 of FIG. 7 and according to the table 800 of FIG. 8.

In some other embodiments, the position processor 3008, the logic look up table 3016 and the threshold look up table 3018 are not upon the magnetic field sensor 3000, but instead, the magnetic field sensor 3000 can include an output format processor 3014 coupled to receive the amplified signal 3006a and operable to generate an x signal 3014a indicative of an amplitude of an x direction (above-described projection upon the x axis) of a vector sum of magnetic fields generated by the above-described first and second magnets 104, 112 of FIGS. 1-6. Thereafter, another processor not on the magnetic field sensor 3000 can identify the physical conditions indicated by the boxes A1, B1, C1, D1, E1 and F1 above.

The x signal 3014a can be one of a variety of formats, for example, a SENT format, and I2C format, and a PWM format.

Figure 31:
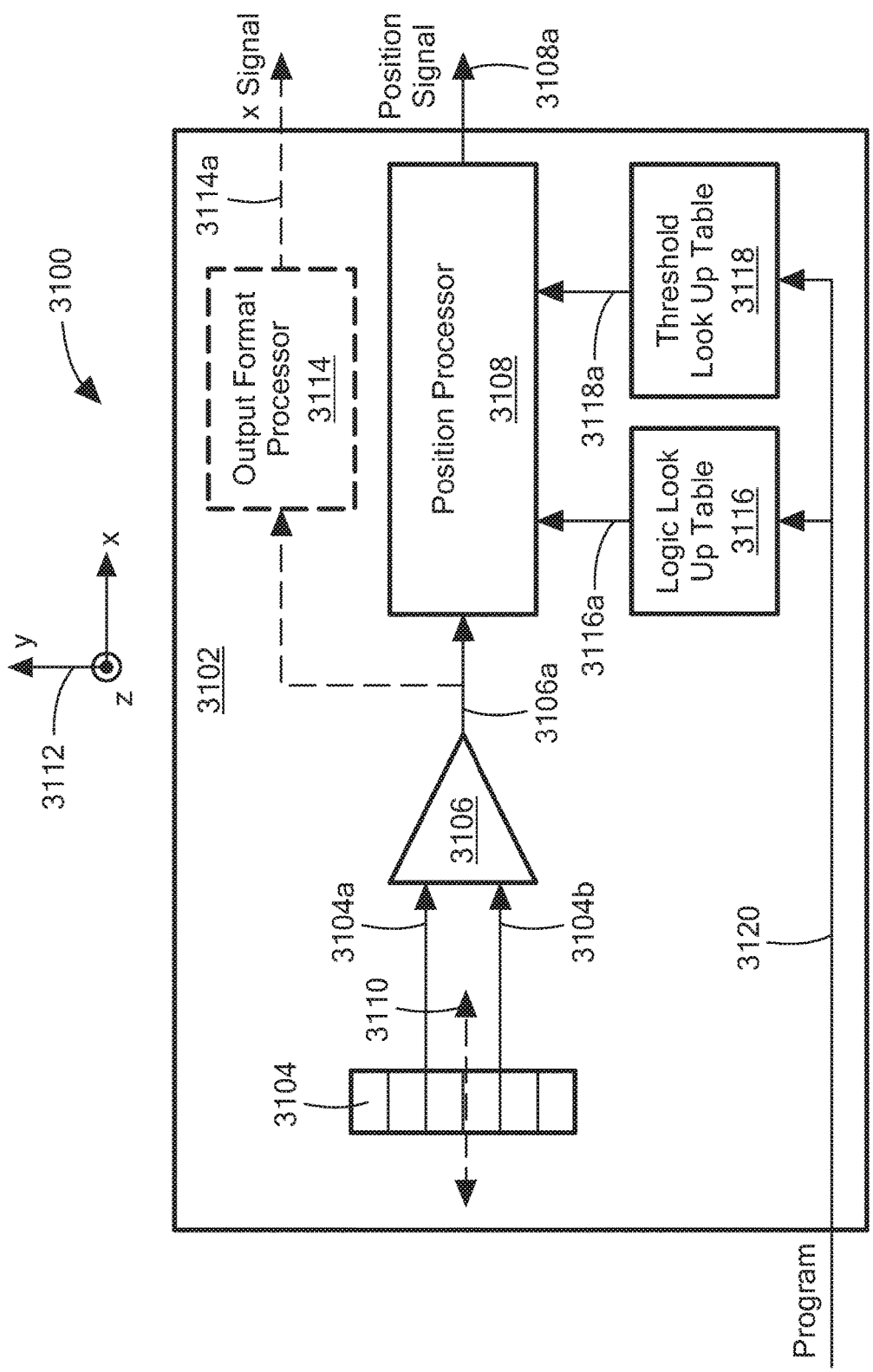
FIG. 31 is a block diagram showing an illustrative embodiment of another magnetic field sensor having a vertical Hall element and electronic circuits all disposed upon a substrate that can be used as the magnetic field sensors of FIGS. 1-6 and that can provide a magnetic field sensor signal representative of the graph of FIG. 7.

Referring now to FIG. 31, a magnetic field sensor 3100 can be the same as or similar to the magnetic field sensor 110 of FIGS. 1-6 and 9-14 and also the same as or similar to the magnetic field sensor 1506 of FIGS. 15-20. The magnetic field sensor 3100 can be operable to generate signal values represented by the graph 700 of FIG. 7 and indicative of an x projection of a vector sum of magnetic fields.

The magnetic field sensor 3100 can include a substrate 3102 having a major planar surface parallel to an x-y plane of a Cartesian coordinate system 3112, which can be oriented in the same way as or in a similar way as Cartesian coordinate systems described above.

A vertical Hall element 3104 can be disposed upon the substrate 3102. The vertical Hall element 3104 can have an axis of maximum sensitivity 2310 parallel to the x axis.

The vertical Hall element 3104 can generate a differential signal 3104a, 3104b.

An amplifier 3106 can be coupled to receive the differential signal 3104a, 3104b and can be operable to generate an amplified signal 3106a.

A position processor 3108 can be coupled to receive the amplified signal 3106a and can be operable to generate a position signal 3108a indicative of at least one of the conditions (i.e., positions) A1, B1, C1, D1, E1, F1 of the assembly 100 of FIGS. 1-6. The position processor 3108 can be the same as or similar to the position processor 3008 described above in conjunction with FIG. 30.

The position signal 3108a can be in one of a variety of formats, for example, a SENT format, and I2C format, and a PWM format.

To this end, the magnetic field sensor 3100 can include a logic look up table 3116 to provide logic information 3116a to the position processor 3108, and the magnetic field sensor 3100 can include a threshold look up table 3118 to provide threshold values 3118a. The logic look up table 3116 can be the same as or similar to the logic look up table 3016 of FIG. 30. The threshold look up table 3118 can be the same as or similar to the threshold look up table 3018 of FIG. 30. A program signal 3120 can be the same as or similar to the program signal 3020 of FIG. 30.

In some embodiments, the position processor 3108 can use the logic information 3116a and the threshold values 3118a according to the graph 700 of FIG. 7 and according to the table 800 of FIG. 8.

An output format processor 3114 can be the same as or similar to the output format processor 2314 of FIG. 23 and can generate and x signal 3114a the same as or similar to the x signal 2314a of FIG. 23.

The x signal 3114a can be one of a variety of formats, for example, a SENT format, and I2C format, and a PWM format.

An output format processor 3114 can be the same as or similar to the output format processor 3014 of FIG. 30.

Figure 32:
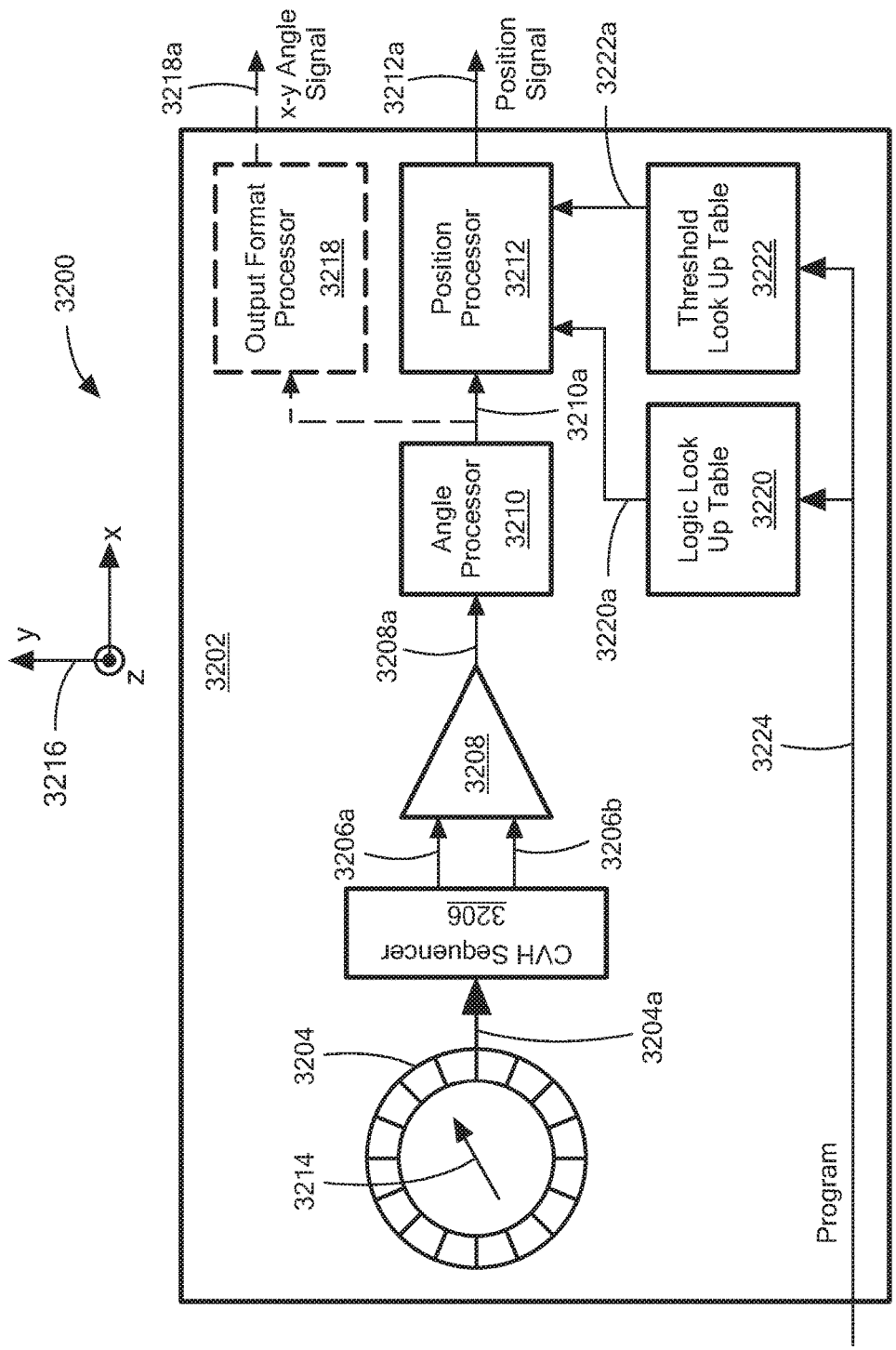
FIG. 32 is a block diagram showing an illustrative embodiment of another magnetic field sensor having a circular vertical Hall (CVH) sensing element and electronic circuits all disposed upon a substrate that can be used as one of the magnetic field sensors of FIGS. 9-20 and that can provide a magnetic field sensor signal representative of the graph of FIG. 21.

Referring now to FIG. 32, a magnetic field sensor 3200 can be the same as or similar to the magnetic field sensor 110 of FIGS. 1-6 and 9-14 and also the same as or similar to the magnetic field sensor 1506 of FIGS. 15-20. The magnetic field sensor 3200 can be operable to generate angle signal values represented by the graph 2100 of FIG. 21 and indicative of an angle of a vector sum (e.g., 1514 of FIGS. 15-20) of magnetic fields.

The magnetic field sensor 3200 can include a substrate 3202 having a major planar surface parallel to an x-y plane of a Cartesian coordinate system 3216, which can be oriented in the same way as or in a similar way as Cartesian coordinate systems described above.

A circular vertical Hall (CVH) sensing element 3204 can be disposed upon the substrate 3202. CVH sensing elements are described in various patent applications assigned to the assignee of the present invention, for example, U.S. patent application publication US-2012-0262155-A1, which is incorporated herein in its entirety.

The CVH sensing element 3204 is operable to identify an angle of a vector sum (e.g., 1514) of a magnetic field, e.g., 3214, in the x-y plane.

The CVH sensing element 3204 can be operable to generate a parallel sequential signal 3204a as sequential ones of signals from a plurality of vertical Hall elements within the CVH sensing element 3204, the sequential ones occurring on separate differential output couplings. A CVH sequencer 3206 can be coupled to receive the parallel sequential signal 3204a and can be operable to convert the parallel sequential signal 3204a to a serial sequential differential signal 3206a, 3206b.

An amplifier 3208 can be coupled to receive the serial sequential differential signal 3206a, 3206b and operable to generate an amplified signal 3208a as a serial sequential signal.

An angle processor 3210 can be coupled to receive the amplified signal 3208a and operable to generate an unformatted x-y angle signal 3210a having values indicative of the angle of the vector sum (e.g., 3214) of the magnetic field in the x-y plane.

A position processor 3212 can be coupled to receive the unformatted angle signal 3210a and can be operable to generate a position signal 3212a indicative of a position A2, B2, C2, D2, E2, F2 of FIGS. 9-20.

The position signal 3212a can be in one of a variety of formats, for example, a SENT format, and I2C format, and a PWM format.

To this end, the magnetic field sensor 3200 can include a logic look up table 3220 to provide logic information 3220a to the position processor 3212, and the magnetic field sensor 3200 can include a threshold look up table 3222 to provide threshold values 3222a. The logic look up table 3220 and the threshold look up table 3222 can be comprised of non-volatile memory devices. In some embodiments, a program signal 3224 can be provided to the logic look up table 3220 and to the threshold look up table 3222 from outside of the magnetic field sensor 3200 to store values therein, the stored values particular to an application in which the magnetic field sensor 3200 may be used.

In some embodiments, the position processor 3212 can use the logic information 3220a and the threshold values 3222a according to the graph 2100 of FIG. 21 and according to the table 2200 of FIG. 22.

In some other embodiments, the position processor 3212, the logic look up table 3220, and the threshold look up table 3222 are not upon the magnetic field sensor 3200, but instead, the magnetic field sensor 3200 can include an output format processor 3218 coupled to receive the unformatted angle signal 3210a and operable to generate an x-y angle signal 3218a indicative of an angle of a vector sum (e.g., 3214) of magnetic fields generated by the above-described first and second magnets. Thereafter, another processor not on the magnetic field sensor 3200 can identify at least one of the conditions (i.e., positions) of the assembly 900 of FIGS. 9-14 indicated by the boxes A2, B2, C2, D2, E2 and F2 above.

The x-y angle signal 3218a can be one of a variety of formats, for example, a SENT format, and I2C format, and a PWM format.

Referring now to FIG. 33, a magnetic field sensor 3300 can be the same as or similar to the magnetic field sensor 110 of FIGS. 1-6 and 9-14, and also the same as or similar to the magnetic field sensor 1516 of FIGS. 15-20. The magnetic field sensor 3300 can be operable to generate angle signal values represented by the graph 2100 of FIG. 21 and indicative of an angle of a vector sum (e.g., 1520) of magnetic fields.

The magnetic field sensor 3300 can include a substrate 3302 having a major planar surface parallel to a y-z plane of a Cartesian coordinate system 3320, which can be oriented in the same way as or in a similar way as Cartesian coordinate systems described above.

A planar Hall element 3304 and a vertical Hall element 3314 can be disposed upon the substrate 3302. The planar Hall element 3304 can have a major response axis 3312 parallel to the x axis. The vertical Hall element 3314 can have a major response axis 3318 parallel to the y axis The planar Hall element 3304 can be operable to generate a differential signal 3304a, 3304b and the vertical Hall element 3314 can be operable to generate a differential signal 3314a, 3314b.

An amplifier 3306 can be coupled to receive the differential signal 3304a, 3304b and operable to generate an amplified signal 3306a. An amplifier 3316 can be coupled to receive the differential signal 3314a, 3314b and operable to generate an amplified signal 3316a.

An angle processor 3308 can be coupled to receive the amplified signals 3316a, 3306a and operable to generate an unformatted angle signal 3308a indicative of an angle in the x-y plane of a vector of a sum or magnetic fields generated by the above-described first and second magnets.

In some embodiments, the angle processor 3308 is operable to compute an arctangent of the amplified signals 3316a, 3306a to generate the unformatted angle signal 3308a. In some embodiments, the angle processor is operable to use a Cordic algorithm to compute the arctangent.

A position processor 3310 can be coupled to receive the unformatted angle signal 3308a and can be operable to generate a position signal 3310a indicative of at least one of the conditions (i.e., positions) of the assembly 900 of FIG. 9-15 (or 100 of FIGS. 1-6) represented by the boxes A2, B2, C2, D2, E2, F2.

The position signal 3310a can be in one of a variety of formats, for example, a SENT format, and I2C format, and a PWM format.

To this end, the magnetic field sensor 3300 can include a logic look up table 3324 to provide logic information 3324a to the position processor 3310, and the magnetic field sensor 3300 can include a threshold look up table 3326 to provide threshold values 3326a. The logic look up table 3324 and the threshold look up table 3326 can be comprised of one or more non-volatile memory devices. In some embodiments, a program signal 3328 can be provided to the logic look up table 3324 and to the threshold look up table 3326 from outside of the magnetic field sensor 3300 to store values therein, the stored values particular to an application in which the magnetic field sensor 3300 may be used.

In some embodiments, the position processor 3310 can use the logic information 3324a and the threshold values 3326a according to the graph 2100 of FIG. 21 and according to the table 2200 of FIG. 22.

In some other embodiments, the position processor 3310, the logic look up table 3324, and the threshold look up table 3326 are not upon the magnetic field sensor 3300, but instead, the magnetic field sensor 3300 can include an output format processor 3322 coupled to receive the unformatted angle signal 3308a and operable to generate an x-y angle signal 3322a indicative of an angle of a vector sum of magnetic fields generated by the above-described first and second magnets. Thereafter, another processor not on the magnetic field sensor 3300 can identify the physical conditions indicated by the boxes A2, B2, C2, D2, E2 and F2 above.

The x-y angle signal 3322a can be one of a variety of formats, for example, a SENT format, and I2C format, and a PWM format.

Figure 34:
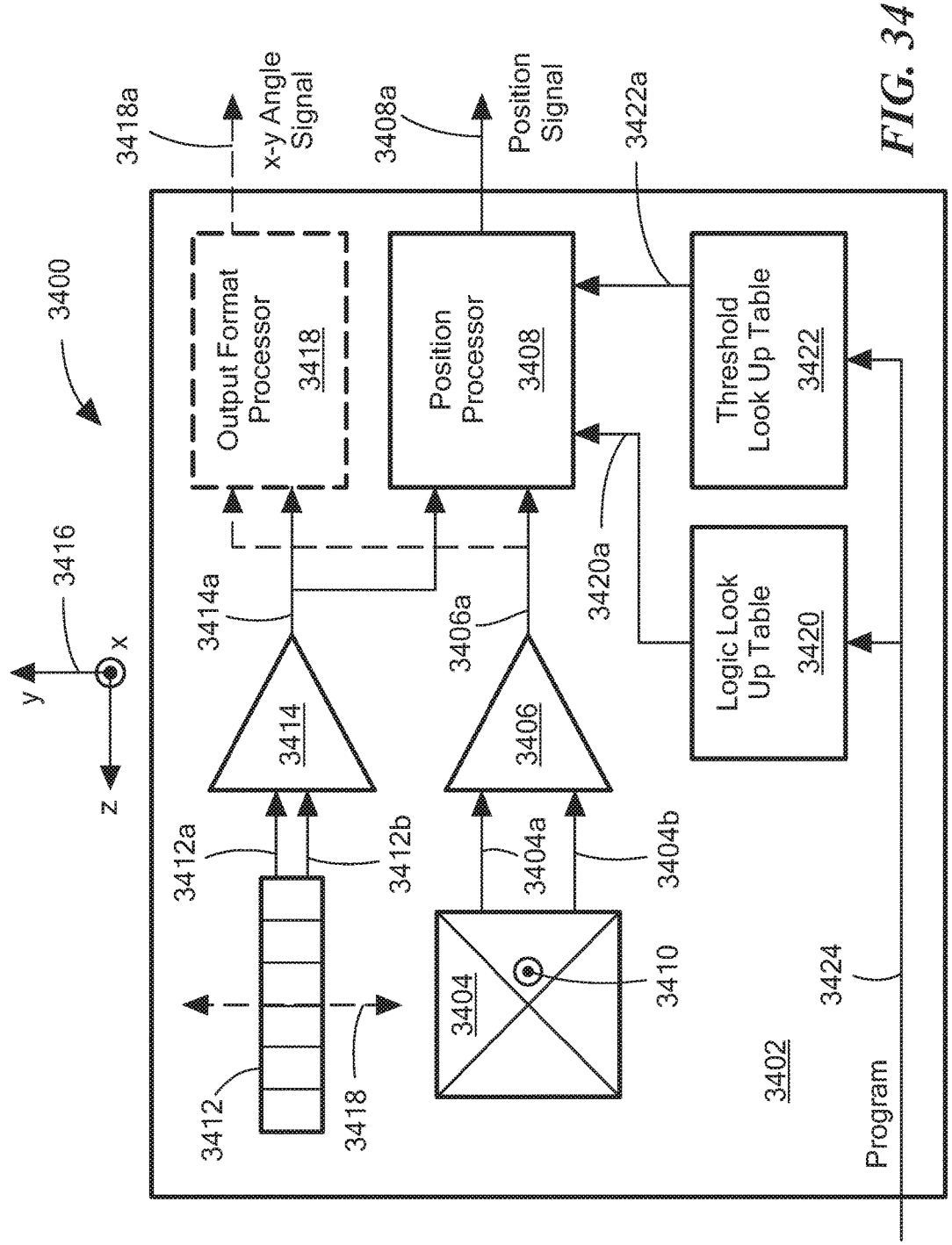
FIG. 34 is a block diagram showing an illustrative embodiment of another magnetic field sensor having both a planar Hall element and a vertical Hall element and also electronic circuits all disposed upon a substrate that can be used as one of the magnetic field sensors of FIGS. 9-20 and that can provide a magnetic field sensor signal representative of the graphs of FIGS. 23 and 24 or the graphs of FIGS. 27 and 28.

Referring now to FIG. 34, a magnetic field sensor 3400 can be the same as or similar to the magnetic field sensor 110 of FIGS. 1-6 and 9-14, and also the same as or similar to the magnetic field sensor 1516 of FIGS. 15-20. The magnetic field sensor 3400 can be operable to generate signal values represented by the graphs 2300, 2400 of FIGS. 23 and 24 or the graphs 2700, 2800 of FIGS. 27 and 28, and indicative of both an x projection and a y projection of a vector sum (e.g., 1520) of magnetic fields.

The magnetic field sensor 3400 can include a substrate 3402 having a major planar surface parallel to a y-z plane of a Cartesian coordinate system 3416, which can be oriented in the same way as or in a similar way as Cartesian coordinate systems described above.

A planar Hall element 3404 and a vertical Hall element 3412 can be disposed upon the substrate 3402. The planar Hall element 3404 can have a major response axis 3410 parallel to the x axis. The vertical Hall element 3412 can have a major response axis 3418 parallel to the y axis.

The planar Hall element 3404 can be operable to generate a differential signal 3404a, 3404b and the vertical Hall element 3412 can be operable to generate a differential signal 3412a, 3412b.

An amplifier 3406 can be coupled to receive the differential signal 3404a, 3404b and operable to generate an amplified signal 3406a. An amplifier 3414 can be coupled to receive the differential signal 3412a, 3412b and operable to generate an amplified signal 3414a.

A position processor 3408 can be coupled to receive the amplified signals 3406a, 3414a and can be operable to generate a position signal 3408a indicative of a least one condition (i.e., position) of the assembly 900 of FIGS. 9-14 (or assembly 100 of FIGS. 1-6) represented by the boxes A2, B2, C2, D2, E2, F2.

The position signal 3408a can be in one of a variety of formats, for example, a SENT format, and I2C format, and a PWM format.

To this end, the magnetic field sensor 3400 can include a logic look up table 3420 to provide logic information 3420a to the position processor 3408, and the magnetic field sensor 3400 can include a threshold look up table 3422 to provide threshold values 3422a. The logic look up table 3420 and the threshold look up table 3422 can be comprised of one or more non-volatile memory devices. In some embodiments, a program signal 3424 can be provided to the logic look up table 3420 and the threshold look up table 3422 from outside of the magnetic field sensor 3400 to store values therein, the stored values particular to an application in which the magnetic field sensor 3400 may be used.

In some embodiments, the position processor 3408 can use the logic information 3420a and the threshold values 3422a according to the graphs 2300, 2400 of FIGS. 23 and 24 according to the table 2500 of FIG. 25 or the graphs 2700, 2800 of FIGS. 27 and 28 according to the table 2900 of FIG. 29.

In some other embodiments, the position processor 3408, the logic look up table 3420, and the threshold look up table 3422 are not upon the magnetic field sensor 3400, but instead, the magnetic field sensor 3400 can include an output format processor 3418 coupled to receive the amplified signals 3406a, 3414a and operable to generate an x-y signal 3418a indicative of a projected x component and a projected y component of a vector sum (e.g., 1520 of FIGS. 15-20) of magnetic fields generated by the above-described first and second magnets. Thereafter, another processor not on the magnetic field sensor 3400 can identify the physical conditions indicated by the boxes A2, 2, C2, D2, E2 and F2 above.

The x-y signal 3418a can be one of a variety of formats, for example, a SENT format, and I2C format, and a PWM format.

While particular illustrative conditions or positions A1, B1, C1, D1, E1, F1 and A2, B2, C2, D2, E2, F2 are shown and described above, this invention is not limited by only those positions. Instead, any positions that employ both linear movement and rotation can be detected and identified.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An assembly oriented in an x, y, z Cartesian coordinate system with an x axis, a y axis and a z axis, comprising:
    a base structure, wherein the x, y, z Cartesian coordinate system does not move relative to the base structure;
    a rotatable structure moveably disposed with respect to the base structure, wherein the rotatable structure and the base structure are operable to move to achieve a relative position along a line relative to each other in a direction tangential to the y axis, and wherein the rotatable structure is operable to rotate to achieve a rotation angle about a rotation axis parallel to the z axis;
    a first magnet fixedly coupled to the base structure, the first magnet having north and south poles aligned along a first line stationary with respect to the base structure, the first magnet for generating a first magnetic field;
    a second magnet fixedly coupled to the rotatable structure, the second magnet having north and south poles aligned along a second line rotatable with the rotatable structure, the second magnet for generating a second magnetic field; and
    a magnetic field sensor disposed proximate to the base structure and proximate to the rotatable structure, wherein the magnetic field sensor comprises:
        at least one magnetic field sensing element for generating at least one sensing element signal responsive to the first and second magnetic fields at a position of the at least one magnetic field sensing element, wherein the at least one sensing element signal is indicative of a combination of a value of the relative position along the line and a value of the rotation angle about the rotation axis.

2. The assembly of claim 1, wherein the magnetic field sensor further comprises:
    a position processor coupled to at least one sensing element signal and operable to generate a position signal indicative of the rotatable structure having the combination of the value of the relative position along the line and the value of the rotation angle about the rotation axis.

3. The assembly of claim 2, wherein the at least one magnetic field sensing element is configured to generate a signal related to an amplitude of a vector sum of the first and second magnetic fields, wherein the position processor is operable to use the amplitude to identify a mechanical disturbance in a relative position of the base structure and the rotatable structure and operable to reverse a direction of rotation of the rotatable structure in response to the identification of the mechanical disturbance.

4. The assembly of claim 2, wherein the magnetic field sensor is fixedly coupled to the rotating structure.

5. The assembly of claim 2, wherein the magnetic field sensor comprises a substrate upon which the at least one magnetic field sensing element is disposed.

6. The assembly of claim 5, wherein a major surface of the substrate is parallel to the y axis and parallel to the z axis.

7. The assembly of claim 6, wherein the at least one magnetic field sensing element comprises a planar Hall element having a maximum response axis parallel to the x axis, and configured to generate the at least one signal related to an amplitude of a projection of a vector sum of the first and second magnetic fields upon the maximum response axis parallel to the x axis.

8. The assembly of claim 7, wherein the position processor is operable to identify a predetermined value of the amplitude to identify the combination of the value of the relative position along the line and the value of the rotation angle about the rotation axis.

9. The assembly of claim 6, wherein the at least one magnetic field sensing element comprises a planar Hall element having a maximum response axis parallel to the x axis and a vertical Hall element having a maximum response axis parallel to the y axis, wherein the magnetic field sensor further comprises an angle processor coupled to the planar Hall element and to the vertical Hall element, and configured to generate an x-y signal representative of an angle in the x-y plane of a vector sum of the first magnetic field and the second magnetic field.

10. The assembly of claim 9, wherein the position processor is operable to identify a predetermined value of the angle to identify the combination of the value of the relative position along the line and the value of the rotation angle about the rotation axis.

11. The assembly of claim 6, wherein the at least one magnetic field sensing element comprises a planar Hall element having a maximum response axis parallel to the x axis and a vertical Hall element having a maximum response axis parallel to the y axis, wherein the planar Hall element is configured to generate a first signal related to a first amplitude determined by a projection of a vector sum of the first and second magnetic fields upon the maximum response axis parallel to the x axis, wherein the vertical Hall element is configured to generate a second signal related to an amplitude determined by a projection of the vector sum of the first and second magnetic fields upon the maximum response axis parallel to the y axis.

12. The assembly of claim 11, wherein the position processor is operable to identify a first predetermined value of the first amplitude and a second predetermined value of the second amplitude to identify the combination of the value of the relative position along the line and the value of the rotation angle about the rotation axis.

13. The assembly of claim 12, further comprising a look up table coupled to the position processor and operable to store a first plurality of predetermined values of the first amplitude and a second plurality of values of the second amplitude, wherein the position processor is operable to use the first and second plurality of values to identify a plurality of different combinations of values of the position along the line and values of the rotation angle about the rotation axis.

14. The assembly of claim 5, wherein a major surface of the substrate is parallel to the x axis and to the y axis.

15. The assembly of claim 14, wherein the at least one magnetic field sensing element comprises a vertical Hall element having a maximum response axis parallel to the x axis, and configured to generate the at least one signal as an amplitude of a projection of a vector sum of the first and second magnetic fields upon the maximum response axis parallel to the x axis.

16. The assembly of claim 15, wherein the position processor is operable to identify a predetermined value of the amplitude to identify the combination of the value of the relative position along the line and the value of the rotation angle about the rotation axis.

17. The assembly of claim 14, wherein the at least one magnetic field sensing element comprises a CVH sensing element, wherein the at least one signal comprises sequential signal from the CVH sensing element, wherein the magnetic field sensor further comprising an angle processor coupled to the sequential signal and configured to generate an x-y signal representative of an angle in the x-y plane of a vector sum of the first magnetic field and the second magnetic field.

18. The assembly of claim 17, wherein the position processor is operable to identify a predetermined value of the angle to identify the combination of the value of the relative position along the line and the value of the rotation angle about the rotation axis.

19. A magnetic field sensor for sensing a position of a rotatable structure, the rotatable structure operable to move to achieve a relative position along a line relative to a base structure and to rotate to achieve a rotation angle about a rotation axis, the magnetic field sensor comprising:

at least one magnetic field sensing element disposed proximate to the rotatable structure, the at least one magnetic field sensing element for generating at least one sensing element signal responsive to first and second magnetic fields at a position of the at least one magnetic field sensing element, wherein the first and second magnetic fields are generated by first and second magnets, respectively, the first magnet proximate to the rotatable structure but not operable to move with the rotatable structure, and the second magnet disposed upon the rotatable structure, and wherein the at least one sensing element signal is indicative of a combination of a value of the position along the line and a value of the rotation angle about the rotation axis.

20. The magnetic field sensor of claim 19, further comprising:

a position processor coupled to the at least one at least one sensing element signal and operable to generate a position signal indicative of the rotatable structure having the combination of the value of the position along the line and the value of the rotation angle about the rotation axis.

21. The magnetic field sensor of claim 19, wherein the base structure is oriented in an x, y, z Cartesian coordinate system with an x axis, a y axis and a z axis, wherein x, y, z Cartesian coordinate system does not move relative to the base structure, wherein the rotatable structure is moveably disposed with respect to the base structure, wherein the rotatable structure and the base structure are operable to move along a line relative to each other in a direction tangential to the y axis, wherein the rotatable structure is operable to rotate about a rotation axis parallel to the z axis, wherein the first magnetic field is generated by the first magnet fixedly coupled to the base structure, the first magnet having north and south poles aligned along a first line stationary with respect to the base structure, and wherein the second magnetic field is generated by the second magnet fixedly coupled to the rotatable structure, the second magnet having north and south poles aligned along a second line rotatable with the rotatable structure.

* * * * *

UNITED STATES PATENT AND TRADEMARK OFFICE
CERTIFICATE OF CORRECTION

PATENT NO. : 10,323,958 B2
APPLICATION NO. : 15/074358
DATED : June 18, 2019
INVENTOR(S) : Stefan Kranz et al.

It is certified that error appears in the above-identified patent and that said Letters Patent is hereby corrected as shown below:

In the Specification

Column 5, Line 29 delete "While electronic circuit" and replace with --While electronic circuits--.

Column 6, Line 49 delete "(See, e.g.," and replace with --(see, e.g.,--.

Column 6, Line 52 delete "axis" and replace with --axis.--.

Column 7, Line 27 delete "boxed" and replace with --boxes--.

Column 9, Line 28 delete "and a magnetic" and replace with --and the magnetic--.

Column 9, Line 33 delete "determination of in which of" and replace with --determination of which of--.

Column 9, Line 63 delete "an also" and replace with --is also--.

Column 10, Line 38 delete "(See, e.g.," and replace with --(see, e.g.,--.

Column 11, Line 41 delete "respect a" and replace with --respect to a--.

Column 11, Line 62 delete "can also use identified" and replace with --can also use the identified--.

Column 12, Line 25 delete "the a similar" and replace with --a similar--.

Column 12, Line 27 delete "the a" and replace with --a--.

Column 12, Line 30 delete "the a similar" and replace with --a similar--.

Column 12, Line 32 delete "the a similar" and replace with --a similar--.

Signed and Sealed this
Third Day of December, 2019

Andrei Iancu
*Director of the United States Patent and Trademark Office*

CERTIFICATE OF CORRECTION (continued)
U.S. Pat. No. 10,323,958 B2

Column 12, Line 34-35 delete "the a similar" and replace with --a similar--.

Column 12, Line 46 delete "and/or and south" and replace with --and/or south--.

Column 13, Line 47 delete ". graph" and replace with --. Graph--.

Column 14, Line 49 delete "sale in units of magnetic field" and replace with --sale in units of magnetic fields--.

Column 14, Line 57-58 delete "sale in units of magnetic field" and replace with --sale in units of magnetic fields--.

Column 15, Line 14 delete "sequences" and replace with --sequence--.

Column 15, Line 35 delete "digital-to-analog (DACs)" and replace with --digital-to-analog circuits (DACs)--.

Column 16, Line 1 delete "at least" and replace with --of at least--.

Column 17, Line 20 delete "and x" and replace with --an x--.

Column 19, Line 14 delete "FIG." and replace with --FIGS.--.

Column 20, Line 14 delete "of a" and replace with --of at--.

Column 20, Line 51 delete "A2, 2," and replace with --A2, B2,--.

In the Claims

Column 24, Line 3 delete "at least one at least one" and replace with --at least one--.